Figure 1:
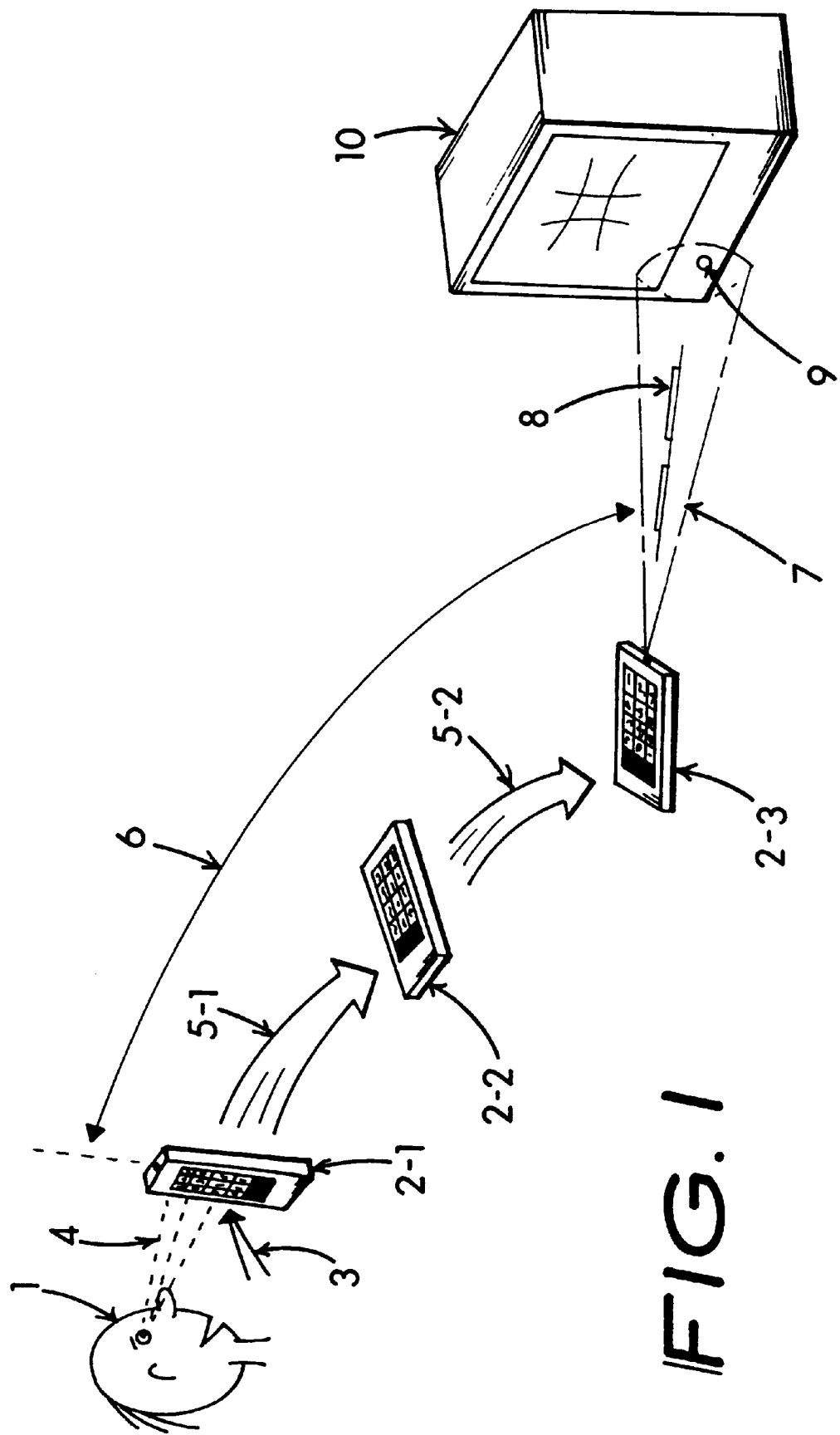

United States Patent [19]
Weber

[11] Patent Number: 6,094,239
[45] Date of Patent: Jul. 25, 2000

US006094239A

[54] REMOTE CONTROL FOR A TELEVISION ENABLING A USER TO ENTER AND REVIEW A CHANNEL SELECTION CHOICE IMMEDIATELY PRIOR TO SENDING AN ENCODED CHANNEL SELECTION COMMAND TO THE TELEVISION

[76] Inventor: Harold J. Weber, P.O. Box 6161, Holliston, Mass. 01746-6161

[21] Appl. No.: 08/940,599

[22] Filed: Sep. 30, 1997

[51] Int. Cl.[7] .................................................. H04N 5/44
[52] U.S. Cl. .................................... 348/734; 341/21
[58] Field of Search .......................... 348/734; 341/176, 341/175, 26, 21; 340/825.69, 825.72, 825.56, 825.3, 825.31, 825.32, 825.34, 825.22; 379/52, 368

[56] References Cited

U.S. PATENT DOCUMENTS

| | | | |
|---|---|---|---|
| 3,899,773 | 8/1975 | Yamauchi et al. | 340/167 R |
| 4,251,812 | 2/1981 | Okada et al. | 340/696 |
| 4,746,913 | 5/1988 | Volta | 340/706 |
| 4,825,200 | 4/1989 | Evans et al. | 340/696 |
| 4,897,718 | 1/1990 | Testin et al. | 358/194.1 |
| 5,045,947 | 9/1991 | Beery | 348/731 |
| 5,046,093 | 9/1991 | Wachob | 380/20 |
| 5,175,538 | 12/1992 | Kurita | 340/825.69 |
| 5,311,175 | 5/1994 | Waldman | 341/34 |
| 5,537,106 | 7/1996 | Mitsuhashi | 340/825.72 |
| 5,557,751 | 9/1996 | Banman et al. | 395/250 |
| 5,600,711 | 2/1997 | Yuen | 379/102 |
| 5,724,106 | 3/1998 | Autry et al. | 348/734 |
| 5,782,036 | 7/1998 | Bertieri et al. | 49/25 |

Primary Examiner—Thomas G. Black
Assistant Examiner—Uyen Le

[57] ABSTRACT

A handheld remote controller device that may be manually programmed while the keypad is conveniently supported in an easy to actuate and readily viewable position in front of a user. Individual keybutton entries are temporarily stored until the entry sequence is complete. Each keybutton entry may be visually displayed for review by the user. When the entry sequence is completed the remote controller device is then aimed at a remotely controlled television set, video tape or video disk player, cable or satellite signal converter. The user initiates a SEND command and the stored entries are retrieved and transmitted from the remote controller device to the receptor of the remotely controlled device as a packet of data which acts to change channel selection or accomplish other tasks in the remotely controlled device. A keybutton entry filter reduces a likelihood for accidental multiple entries which may be caused by tremors and other physical or mental maladies. In this way, physically challenged persons, or elderly persons in particular, may be enabled to utilize a remote control function with less chance for error. When only a single number channel, such as channel 5 is selected, a necessitous leading zero is automatically added to the SEND dispatched command.

22 Claims, 14 Drawing Sheets

REMOTE CONTROL FOR A TELEVISION ENABLING A USER TO ENTER AND REVIEW A CHANNEL SELECTION CHOICE IMMEDIATELY PRIOR TO SENDING AN ENCODED CHANNEL SELECTION COMMAND TO THE TELEVISION

BACKGROUND OF MY INVENTION

Television receivers (TV-sets), video cassette recorders (VCR), cable converters, satellite receivers and other consumer oriented entertainment apparatus commonly include remote controlled operation of tuning and other functions to afford additional convenience for the user. Typically, a channel selection for a television station is entered using a portable hand-held remote controller. In the usual arrangement, the channel number is keyed into a keypad digit-by-digit while the remote controller is aimed directly at the remotely controlled TV-set. Nearly all remote control interfaces of this type utilize infrared light beam coupling, which infers that the remotely controlled TV-set most be within a direct line-of-sight of the handheld remote controller device.

An ordinary handheld remote controller must also be aimed at a specific area (or "receptor zone") of the TV-set in order to operate reliably. The location on the face side of the TV-set where the usual photoreceptor is sited is the optimal location for aiming. No intervening furniture or decorating accessories may be allowed to block the line-of-sight extension between the controller and the TV-set in order to obtain consistent operation.

PRIOR-ART EXAMPLE

An "ONE FOR ALL 4 DEVICE" model URC-4060 handheld remote controller apparatus manufactured by Universal Electronics, Twinsburg, Ohio is an excellent example of a modern (e.g., current-art) multi-option remote controller device offering numerous features which enhance its usability, convenience and flexibility for a capable user. This particular remote controller device is intended for use with up to four distinctly different types of remote controlled apparatus, such as a TV-set, VCR, cable converter, and satellite receiver. This particular remote controller is provided with "numeral shaped" keys for channel selection. The keytops glow in the dark, and the arrangement of the channel UP/DOWN and volume UP/DOWN control buttons are arranged logically in a circle, with a centric "sound mute" button location.

Line-of-Sight Orientation Difficult

Observed drawbacks for this particular form of handheld remote controller device characterize the shortfalls of virtually all universal-type or manufacturer-specific remote controllers. One of the drawbacks is a longstanding problem that the controller "front-end" must be held within an absolutely clear line-of-sight orientation relative with the photoreceptor window on the to-be controlled TV-set, VCR, or cable converter box. A more vexing inconvenience is the need for maintaining the line-of-sigh orientation without interruption for the duration of making all pertinent entries on the remote controller device keypad.

Operating Position Awkward

Persons who are visually or physically challenged encounter a problem using even the best ordinary handheld remote controllers. The principal character of the problem is a "must-do" need to make entries while necessarily holding the controller at an awkward angle which is inconvenient for enabling the user's unencumbered viewing of the keypad portion of the controller. The awkward angle to which I refer typically places the controller's keypad nearly oblique with the user's eyes, but the awkward position is necessary in order to maintain the uncompromising line-of-sight orientation requirement which must be maintained between the remote controller and a distant TV-set.

Entries Must be Made Quickly

When the user keys-in a sequence of channel selection numbers, they must be entered quickly. For example, to select channel 36, the first entry number 3 is keyed-in and the second entry number 6 must also be immediately keyed-in, without a hesitation of more than a few seconds. If too much time passes after the first number is keyed-in, the second entry will be ignored in the usual remotely controlled device, such as a TV-set or a VCR. As a result, the selection will be automatically returned to the channel which was already selected before the change was attempted.

This relapse can cause confusion as to what channel selection has occurred. The allowable amount of time which may elapse between successive entries is independent of the remote controller device, since it is solely determined by engineering choices made in the internal circuitry of the controlled TV-set, VCR, cable converter or satellite receiver, and is ordinarily on the order of five seconds, more or less. In other words, this timeout occurrence is outside the parameter determination capability of the handheld remote controller hardware design.

User confusion regarding channel selection is further exacerbated by a need for entering at least two separate digits regardless of selection of a single number channel, such as any channel between 2 and 9. Channel 7 for example has to be entered as the two digits 07. In other words, entering the keybutton 7 selection alone results in a false or incomplete selection and time-out in prior art controllers and the TV-set or VCR will simply remain on the channel to which it was already set prior to the thwarted attempt to change channels.

Selections Hard to Determine

Many users of consumer electronic devices which operate by remote control have physical and vision related limitations. For example, a person who may have impaired vision may wear glasses to afford distant viewing of the TV-set, or conversely may need glasses to view close-in matter such as the control button indicia of the remote controller. This sharply defines two distinct viewing conditions, brought about by two different viewing distances. As a result, the viewer is at a severe disadvantage to achieve all of the requirement for operation of the remote controller, not the least of which is to do it quickly. On-screen channel number depiction, while an obvious improvement over older digital displays, or early channel selector knobs, still implies that a user must quickly switch viewing distance ability between the keybutton indicia on the nearby hand-held remote controller and the more distant channel number or menu display shown on the TV-set's viewing screen. For many viewers, this is an extremely difficult accommodation which entails significant readjustment of viewing distance by the user's eyes, while at the same time necessitating quick and sure response, lest an erroneous entry will occur.

Vision impairment for purpose of what my invention's novelty is found is not necessarily a severe form of vision loss, but rather that common state which many persons find themselves in where there is considerable variation between their near and far sight performance. As a result, since a remote controller is a near field vision condition and a TV-set is a relatively far field vision state, some loss in response by the user occurs due to an ongoing re-accommodation of two differing viewing field distances which tends to slow down the necessary keypad actuation response time when using a remote controller. This situation becomes particularly acute when the ambient light level is dim.

Physical Dexterity Considerations

Aged persons who may have far more substantial vision impairment are at particular disadvantage, since the requirement for performing quickly is at odds with their slowed down thought processes and physical capability. Additionally, having to press the buttons of a typical remote controller while concurrently holding it at what may be a physically inconvenient angle necessitated for line-of-sight coupling is contrary to the sheer physical dexterity of many viewers. Take for example a person afflicted with arthritis who undoubtedly finds it unwieldy, if not virtually impossible, to satisfactorily and soundly press a keybutton while at the same time holding and aiming the remote controller towards the TV-set at a necessarily awkward angle. Under such a condition, which afflicts millions of persons, usage is limited by reduced joint flexibility coupled with debilitating pain.

Viewer Program Choices Become Limited

A result of this existing impasse involving many viewer's ability to readily and assuredly change channel selections leads to a subtle but real stifling of a viewer's ability to exercise a choice of program viewing options. Fear that a wrong channel will be selected, or sheer inability to satisfy the several seemingly conflicting requirements for achieving channel re-selection induces the viewer to often "stay-with" a less desirable program choice, while passing up a better program possibility. In truth, viewers often become "locked into" one or at most just a few available channel choices out of fear of ability to effect remote control operation. Often this is due to the confusing and physically difficult to achieve channel changing which another program choice might entail.

Worse yet for the elderly person is the loss of dignity which goes with being at the mercy of someone else to change TV set channels. Remote control access of a TV set is probably more beneficial to the elderly or physically challenged person than any other single category of viewers. Unfortunately, prior art remote controllers do not afford convenient access to the remote control possibilities of an average TV set, with the result that the elderly or physically challenged person is denied comfort and pleasure to which they should be entitled. My invention now overcomes these obstacles and enables reliable remote control operation for the vast majority of the elderly and physically challenged persons who have here-to-fore not been given consideration and provided for by the prior art.

1. Field of My Invention

My invention pertains to hand held, portable remote control devices frequently utilized to change channel selections and other options on entertainment apparatus, such as television receivers, video cassette recorders, cable converter boxes, satellite television signal receivers, and other consumer electronics equipment.

2. Description of Prior Art

Existing commercial handheld remote controllers utilize a keypad into which a succession of individual number digits must be entered, ordinarily in a quick succession. Hesitation between entering the first digit and the second digit may result in an erroneous or failed entry since the usual remotely controlled TV-set simply times-out if the entry sequence is not completed fast enough. In the typical TV-set or similar apparatus, this timeout usually occurs in about five seconds. This time-out is not a fault or shortfall of the remote controller, but rather it intentionally rests in the intrinsic hardware design of the controlled TV-set, VCR, etc. As a result, the maker of the usual hand-held remote controller is frequently blamed for a perceived time-out problem which is in fact not of his making.

Infra-Red Light Beam Coupling

Virtually all contemporary remote control schemes utilize a similar wireless intercoupling principal, that of sending a uniquely encoded pulsed infra-red light beam between the hand held device and a photoreceptor integral with the distal TV-set, VCR, cable converter, satellite dish receiver, etc. The art-form defining the characteristics of the encoded pulsed light beam has been around for a long time and has been shown to perform reliably in many millions of TV-sets and other electronic devices. Motorola and other manufacturers produce application specific integrated circuits (such as the well known MC14457P and MC145026) which are intended for the encoding and modulation of wireless transmissions.

Aging of General Population Considered

What is sorely missing in the prior art is an interface scheme which enables a less than optimally capable user to utilize most, if not all, of the features of a remote controller without compromise and frustration. Observation and experience indicates that, in view of the aging general population, enormous numbers of users must necessarily encounter a limited capability for readily achieving much more than a mere rudimentary level of operation for nearly all of today's widely available hand-held remote control devices, irrespective of whom the manufacturer might be.

Trivial Differences in Prior-Art

Most portable remote controllers are functionally alike. It is only a refinement of relatively trivial implementation details which vary. For example, some controllers sport keys shaped like numbers which are obviously easier to see in dim light than plain round keys. More recently, manufacturers have implemented back-lit or glow-in-the-dark keyboard layouts to enhance dim light visibility. A rearrangement of keyboards is a more recent phenomenon, where the channel UP/DOWN and volume INCREASE/DECREASE keys have been placed in a circular arrangement to assist in tactile association. Unfortunately, the layout still varies between makers and the result is unnecessary confusion.

Physical Orientation Difficult

An ordinary user typically grasps the remote controller in his left hand while aiming the front-end of the controller towards the TV-set. At the same time, he uses his right hand fingers to pick-out and press the appropriate buttons for channel re-selection or for menu functions, such as picking between the TV-set, VCR and cable converter.

This positional orientation places the user in an operationally conflicting setting. Frequently, the receptor area on a remotely controlled TV-set is sited just below the bottom of the screen. Similarly, the remotely controlled VCR or cable converter may be setting on a shelf below the TV-set placing the receptor area even lower for these devices. As a result, the user necessarily must tilt the front end of the remote controller downward from, or at best about straightforward.

This forward facing, or slightly downward tilted facing of the front of the remote controller places the keypad portion of the remote controller at a disadvantageously upward facing relationship which often results in an obliquely oriented keypad relationship relative with the user. In many cases, such an inconvenient orientation becomes far more severe, considering that many remote control users are TV viewers who are sitting on sofas, in reclining chairs, or lying in bed.

Such is the state of the prior art. Remote controllers lend themselves for best and most reliable operation in a physical position which is inconvenient for many users. Less obvious is that situation where the keybuttons on the remote controllers are hard to actuate. Such a difficult operating situation is particularly exasperated by persons experiencing physical disability, vision impairment, tremors, mental hesitancy and other difficulties which typically afflict many otherwise perfectly intelligent persons as they age. Therefore, the prior art does not adequately provide for this significant group of remote control users.

Providing User Independence

Elderly and physically weakened persons, as well as persons experiencing weakened eyesight performance for any of a variety of reasons are often limited in their ability to use ordinary remotely controlled entertainment equipment such as a TV-set or a cable converter, with the result that they may lose their right to freely pick their choice of television programs. This incapacity to achieve remote control of their TV-set or cable converter generally causes them to rely upon the services of another person to make their selections, thereby forfeiting their independence and to instead become dependent upon the response, and sometimes even the decision making control, of another person. An elderly person, for example including one who may be unable to work a remote controller herself, may have to rely upon another person for a mere changing of channels. This reliance may subsequently result in the other person also determining exactly which channel will be selected. Even when well-intentioned, this sort of situation results in a severe loss of freedom of choice and independence of action for the afflicted person.

This same type of intrinsically limiting problem of operational independence may manifest itself in a variety of other settings, including that of a dimmed-down room where even a moderately vision-impaired person may have a problem with at least quickly operating the remote controller. Additionally, a person who is using medication or imbibing an alcoholic beverage may have slowed responses or suffer some confusion which can thwart reliable remote controller operation. Obviously, this latter setting fits the scene for common forms of spectator sports, such as a football game or the like, where a bit too much beer or malt liquor may result in a loss of ability to satisfactorily use the remote controller, at least in a quick and sure manner as demanded by the prior art devices.

SUMMARY OF MY INVENTION

My invention focuses on a correction of numerous shortfalls of the prior art when it comes to certain fundamental aspects regarding a basic usability of a portable remote controller such as those which are conventionally utilized with remote controlled entertainment apparatus, such as a TV-set, VCR, cable converter, and similar equipment. In particular my invention addresses usage of the portable remote controller by elderly persons, and other persons who may be physically challenged or vision challenged, or who are merely experiencing lapses in capability due to medication side-effects and the like. Obviously, this encompasses a large segment of the contemporary population.

The conventional usage of a remote controller for next channel selection of a TV station, for example, entails aiming a wireless emitter (usually a light emitting diode, or LED) portion of the remote controller in an unobstructed manner towards the frontispiece portion of the controlled apparatus, such as a TV-set or VCR. Prior to my invention, the user typically has to enter at least two digits representing the desired next channel selection while concurrently aiming the remote controller. The result is a piecemeal sending of entry data between the remote controller and the controlled device since each entry is immediately sent upon its individual entry. More urgently, the two digits have to be entered with a sequential quickness of action, because the typical TV-set includes a time-out provision which simply resets the channel to (or maintains the channel on) the previously viewed channel, typically after a delay of five seconds, more or less. For example, if the TV-set is running on channel 8 and the user wishes to change to channel 27, the usual action steps include:

1. Raise or position the remote controller to aim directly towards the TV-set.

2. Press the keypad key representing the channel numeral 2.

3. Quickly press the keypad key representing the channel numeral 7.

4. If the 2 entry followed the 7 entry is quick enough, the TV-set switches to channel 27.

5. If the 7 entry lagged to far behind the 2 entry, the TV-set remains on channel 8.

Entries May Now be Temporarily Stored

I realized that a great advantage is had if the the desired next channel selection numbers, such as 2 and 7 in this example, are simply entered into the remote controller while the remote controller device is held in the user's hand in a manner similar to that of an ordinary hand calculator. The two or so entries are subsequently held (or temporarily stored) in a local register portion of the remote controller, and not immediately sent to the TV-set.

Upon a satisfactory completion of the entry of the two channel selection digits, the user may raise the remote controller in a manner necessary to aim it at the TV-set to achieve wireless coupling. Then a single common button (such as a SEND button) is pressed by the user, and an encoded burst (or binary packet) of pulled data is sent to the TV-set representing both of the previously made entries of 2 and 7.

Two paramountly important goals are achieved in this example, being:

1. Entry of the component next channel selection numbers 2 and 7 as mentioned can be done at a leisurely pace by the user, thereby accommodating even the slowest or most hesitant user. No time-out occurs no matter how slow and hesitant the user is.

2. Sending of the two component next channel selection numbers to the remotely controlled TV-set is done in rapid-fire succession, thereby thwarting a likelihood for the TV-set to time-out and remain on the previous channel.

In addition to achieving these goals, my invention also allows for a correction of an errant channel number entry before the remotely controlled TV-set even receives the instruction, therefore preventing an irritating switching onto an unwanted channel.

User's Entries are Displayed

I prefer that a digital number display of the entered channel number digits (e.g., 2 or 3 numeral digits) appears on the front of the remote controller, visually cuing the user of the value of the entered channel number digits prior to sending data to the remotely controlled TV-set or cable converter for channel selection. I find that a back-lit LCD, or a 7-segment LED display is preferable to afford readability in a dimly lit room which is characteristic of a TV viewing area, or a bedroom. I also prefer that light-up of the display be maintained only for a brief period of time subsequent to a keypad entry in order to conserve battery power.

I find that maintaining display visibility for about thirty seconds after the first entry and about ten seconds after the second entry provides sufficient time for a majority of users. I also find that providing an option for two different time periods between the first and second entry may be beneficial, with the mentioned thirty seconds being appropriate for the average person who is merely a laggard in making a second entry. Alternatively, an extended time of several minutes may be more suitable for a person who is elderly, or otherwise handicapped and expresses actions with great hesitancy. It remains that lit display time-out is preferred to conserve battery dissipation.

Single Command Button Control

In an extension of my invention, I have found an advantage in being able to pre-enter and temporarily store certain other programmable commands which usually originate from my remote controller. Following their entry, the temporarily stored data is wirelessly routed to the TV-set, VCR or cable converter for action using the same common button (or SEND button) typically used to send next channel selection number data. An advantage of using a common button to send all sorts of data is that when the preloaded data is ready to be sent, the remote control can be raised to a best position for wireless intercoupling, and then the common button is pressed. The user develops exceptional familiarity with location and feel of this same common button, eliminating confusion which may otherwise occur when various other buttons must be pressed when the keypad is not readily visible.

An example of this use is when the remote control is used with a remotely controlled TV-set and a remotely controlled VCR. To change from a commercial or cable channel to VCR operation (playing of a rental tape, for example) requires numerous steps to achieve switchover. For example, assume that a program on channel 25 has been on and the user wants to begin a playing of a VCR movie tape. The necessary prior art remote controller steps (using a universal type of remote control) ordinarily involve:

1. Press the TV button.
2. Press number 0.
3. Press number 3. (Switches TV-set to channel 3)
4. Press the VCR button.
5. Press the POWER ON button. (To turn VCR ON)
6. Press the (VCR)PLAY button.

Be aware that each and every one of these steps 1–6 demand that the remote controller be in line-of-sight with the remotely controlled TV-set and the remotely controlled VCR in order to enter each step's associated command data.

All Entries Made Before Sending Command

With my instant invention, the remote controller is conveniently held in front of the user like a calculator. Each entry is made as needed for steps 1–6 as said above. The big difference is that the remote controller need not be in sight of the remotely controlled TV-set. The entries can be made even in another room (e.g., perhaps the bathroom). Only after all of the entries are made, does the remote controller have to be aimed at the remotely controlled TV-set and the remotely controlled VCR, whereupon a step 7 is utilized, which is to press the common button and quickly send all of the next channel selection and command data to the TV-set and the VCR as a rapid-fire packet of data instructions. As a result:

1. The TV-set switches to channel 3.
2. The VCR power turns-ON.
3. The VCR begins to PLAY the tape.

If neatness counts, this is about as neat as remote controlled operation of a TV-set and VCR can get.

Single Channels Require Only a Singe Entry

In all known prior-art remote controllers, at least two key entries must be made even when selecting the lower channels 2 through 9. This is to say that the following sequence must occur to merely change the TV set to channel 6:

1. Press the TV button.
2. Press number 0.
3. Press number 6. (Switches TV-set to channel 6)

These entries must be made while the remote controller is held towards the TV set, which makes entry difficult for the reasons already discussed. With my invention, to select channel 6 a user may follow an easier sequence. While holding the remote controller in a viewable position, the user steps are:

1. Press the TV button.
2. Press the number 6.

Raise and hold up the remote controller to be aligned with the front of the TV set.

3. Press the SEND button.

At this last step 3, the remote controller sends an automatically constructed number 0 followed by a number 6 sequence which is recognized by the remotely controlled TV set or other apparatus as though it had originated from a common (e.g., prior art) type of remote controller.

Automatic Channel 3 or 4 Selection

A typical cable converter or VCR usually calls for the attached TV-set to be set to channel 3 or channel 4 while either the cable converter, the satellite receiver, or the VCR are in operation. I find that great advantage is served in a sense of convenience and relative with reducing operational confusion if the controlled TV-set is automatically sent a channel 3 (or channel 4) selection signal each time a cable converter, a satellite receiver, or a VCR is utilized. In other words, any activity directed to any one of these accessory devices initiates a signal which commands or reaffirms the remotely controlled TV-set to switch to a necessitous interface channel, e.g. usually TV channel 3 or 4.

Channel Blocking Denies Access

I have further found it to be advantageous to provide channel blocking, wherein certain predetermined channels which might be entered through the keypad numbers and temporarily stored in the holding register are flatly denied transmission to the TV-set when the common SEND button is pressed. For example, aside from unused channels, certain adult (e.g., pornographic content) movie cable channels may be effectively blocked selection through the remote controller using this approach.

OBJECTIVES OF MY INVENTION

A most novel object for my invention is to free a user of a remote controller from the awkward necessity for concurrently making a keypad command entry selection and at the same time having to aim the remote controller at the associated apparatus, such as a remotely controlled TV-set, VCR or cable converter.

My invention offers a distinct separateness between the action of entering selections into a remote controller and the action of sending the selections to the associated apparatus, such as the remotely controlled TV-set, VCR or cable converter.

An aspect of my invention pertains to allowing a user to leisurely enter a series of next channel selection number digits and other operating commands into the keypad of a remote controller, whereby the individual entries are locally stored in a holding register. Upon initiating a singular sender command keybutton the stored entries are quickly readout and wirelessly submitted as a packet of data information to the associated apparatus such as the remotely controlled TV-set, VCR, cable converter, or other apparatus.

A significant object for my invention is to locally show a user's intended selections upon a viewable digital display portion of the remote controller for confirmation of selection entry correctness prior to wirelessly sending the associated selection data to the associated apparatus such as the remotely controlled TV-set, VCR or cable converter.

A goal of my invention is to remove a time dependent necessity for making sequential entries such as individual digits of a television channel number while using a remote controller, lest inadvertent time-out occurs and the selection remains uncompleted.

A resulting objective of my invention is make entry of television channel number selection using a remote controller far easier for physically challenged and elderly persons.

Another rendered objective for my invention is to enable a vision limited person to make more accurate television channel number selections using a remote controller by providing a confirmable local display of next channel number selections prior to their being sent to the remotely controlled TV-set or cable converter.

Another goal for my invention is to deliver an audible annunciation of each keypad entry prior to data entry to enable a user confirmation in a dimly lit environment where keybutton visibility may be limited.

Yet another objective for my invention is to automatically normalize the remotely controlled TV-set by sending a precursor channel change instruction to the tuner of the TV-set to reset or reaffirm the necessitous channel setting of the TV-set to a predetermined channel, such as 3 or 4, whenever any command is otherwise sent to a peripheral device, such as a VCR, cable converter or satellite receiver.

A conatus of my invention is to automatically insert leading zero digits ahead of a single channel numerical selection made on the keypad. As a result the user merely enters the single channel number selection such as 7 and presses the SEND button.

DESCRIPTION OF MY DRAWINGS

My invention is depicted on 12 sheets of drawings including 14 illustrative figures.

FIG. 1—Overview of invention's interface between a user and a television set.

Figure 2:
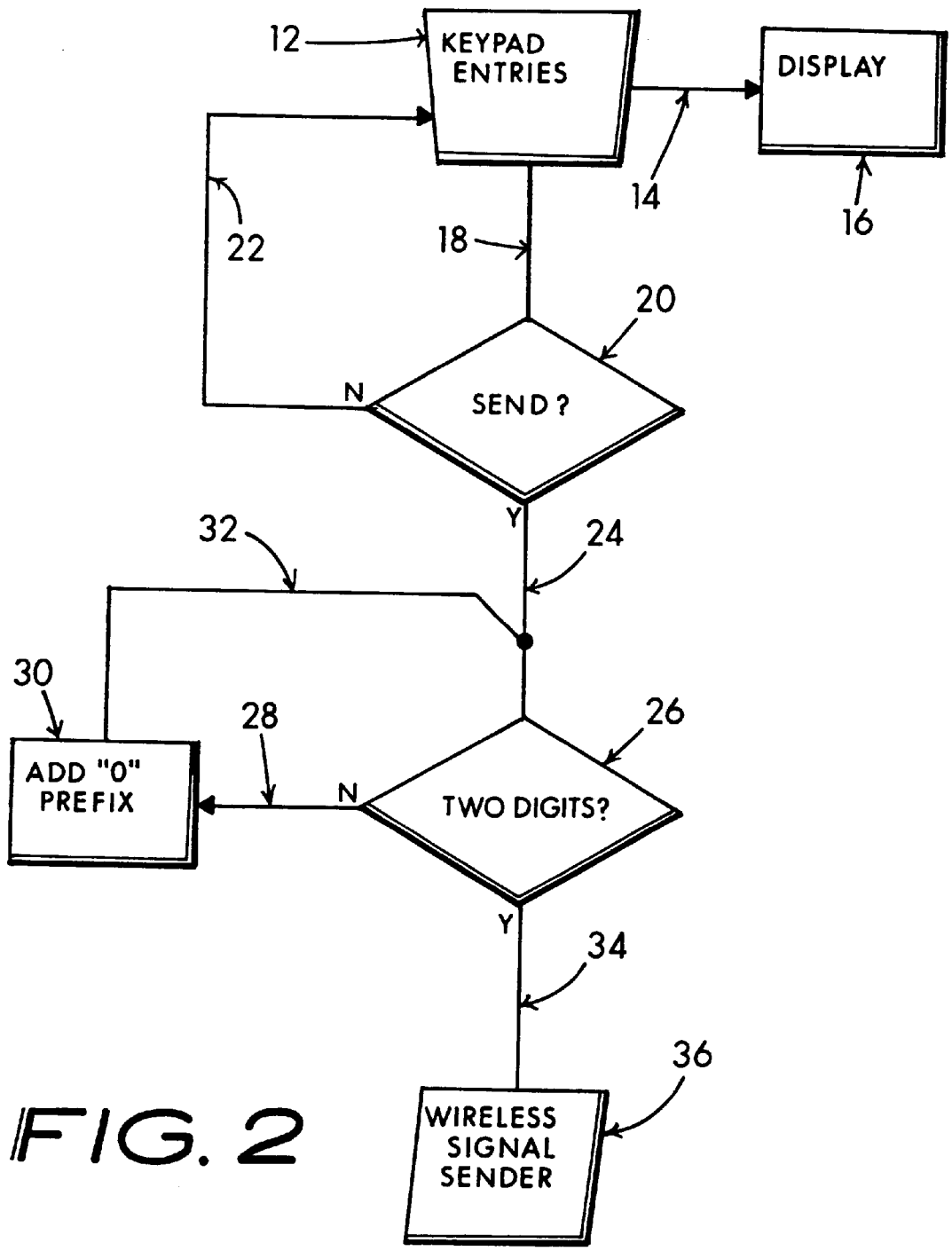

FIG. 2—Flow chart showing entry processing.

Figure 3:
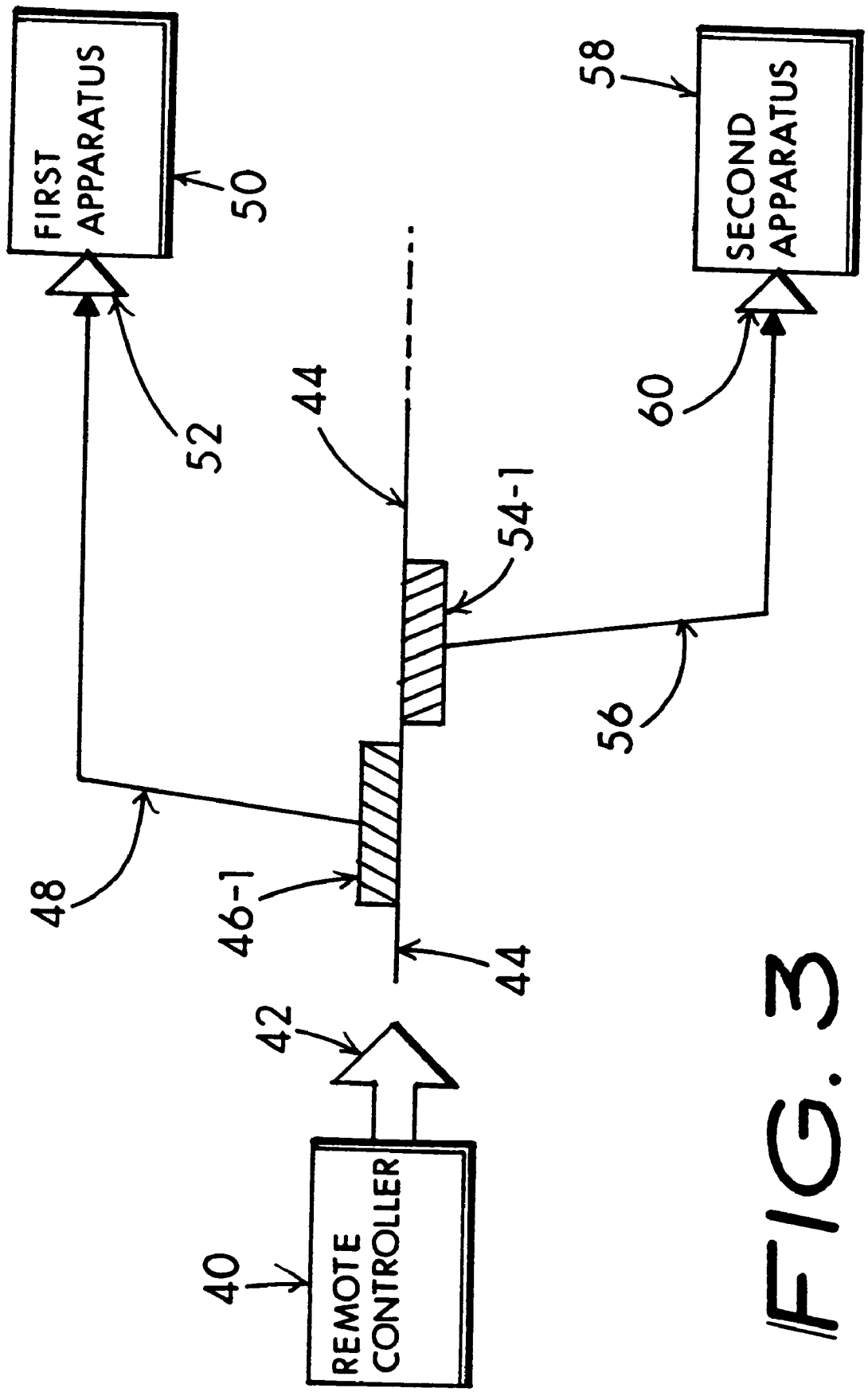

FIG. 3—Functional diagram showing remote controller dispatching signal to two separate receptor apparatus.

Figure 4:
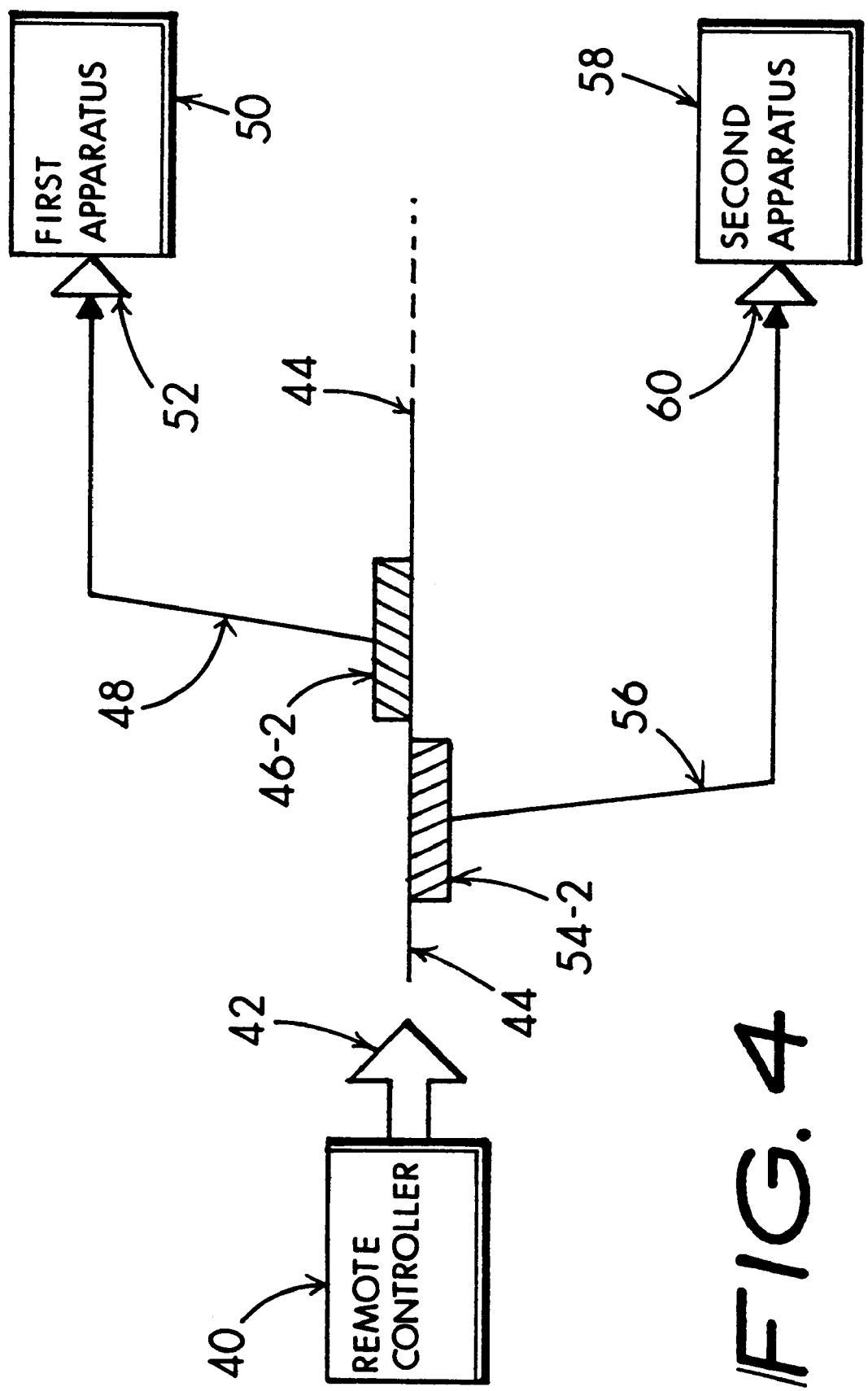

FIG. 4—Functional diagram showing remote controller dispatching signal to two separate receptor apparatus.

Figure 5:
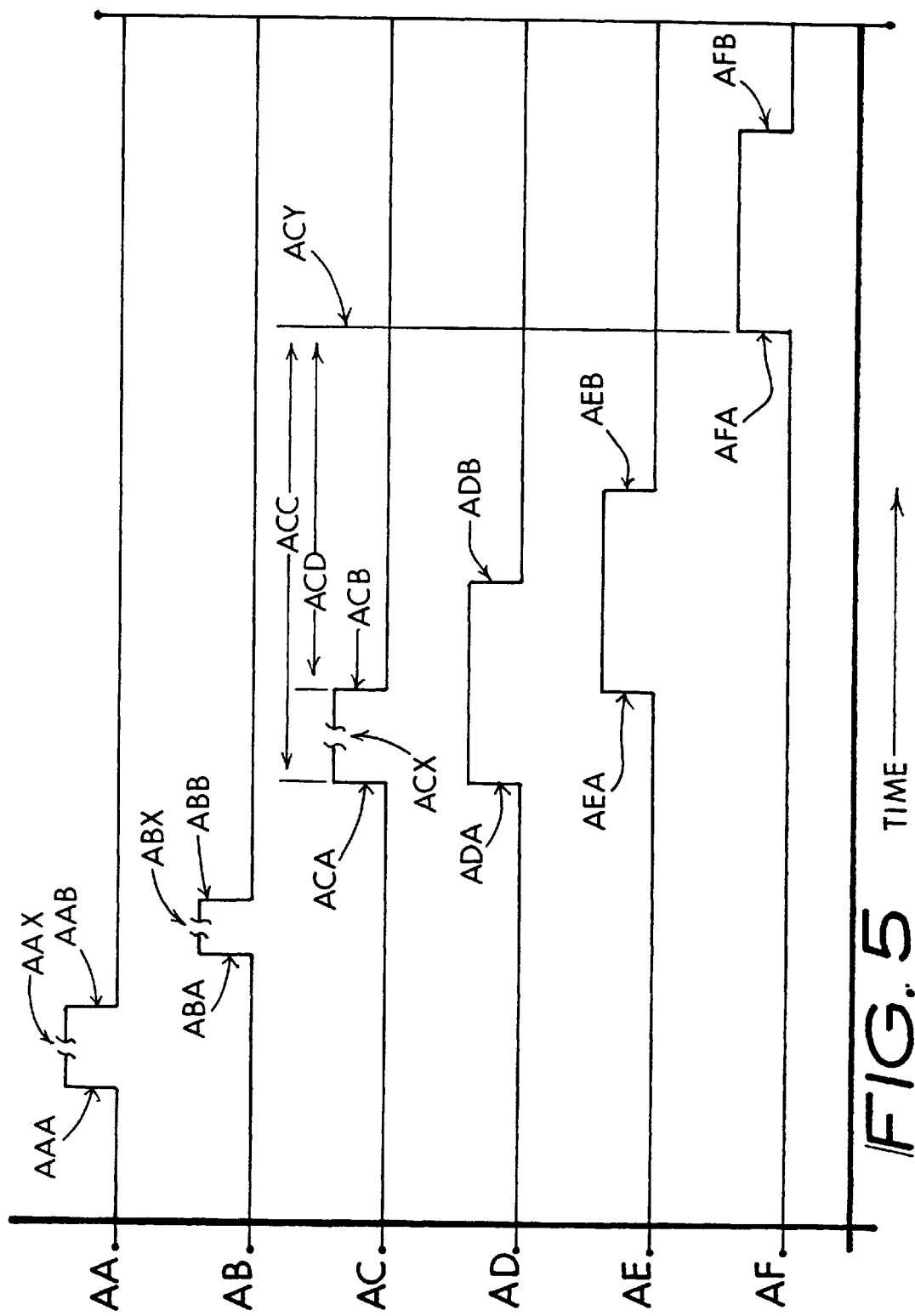

FIG. 5—Timing diagram of entry and signal dispatch events.

Figure 6:
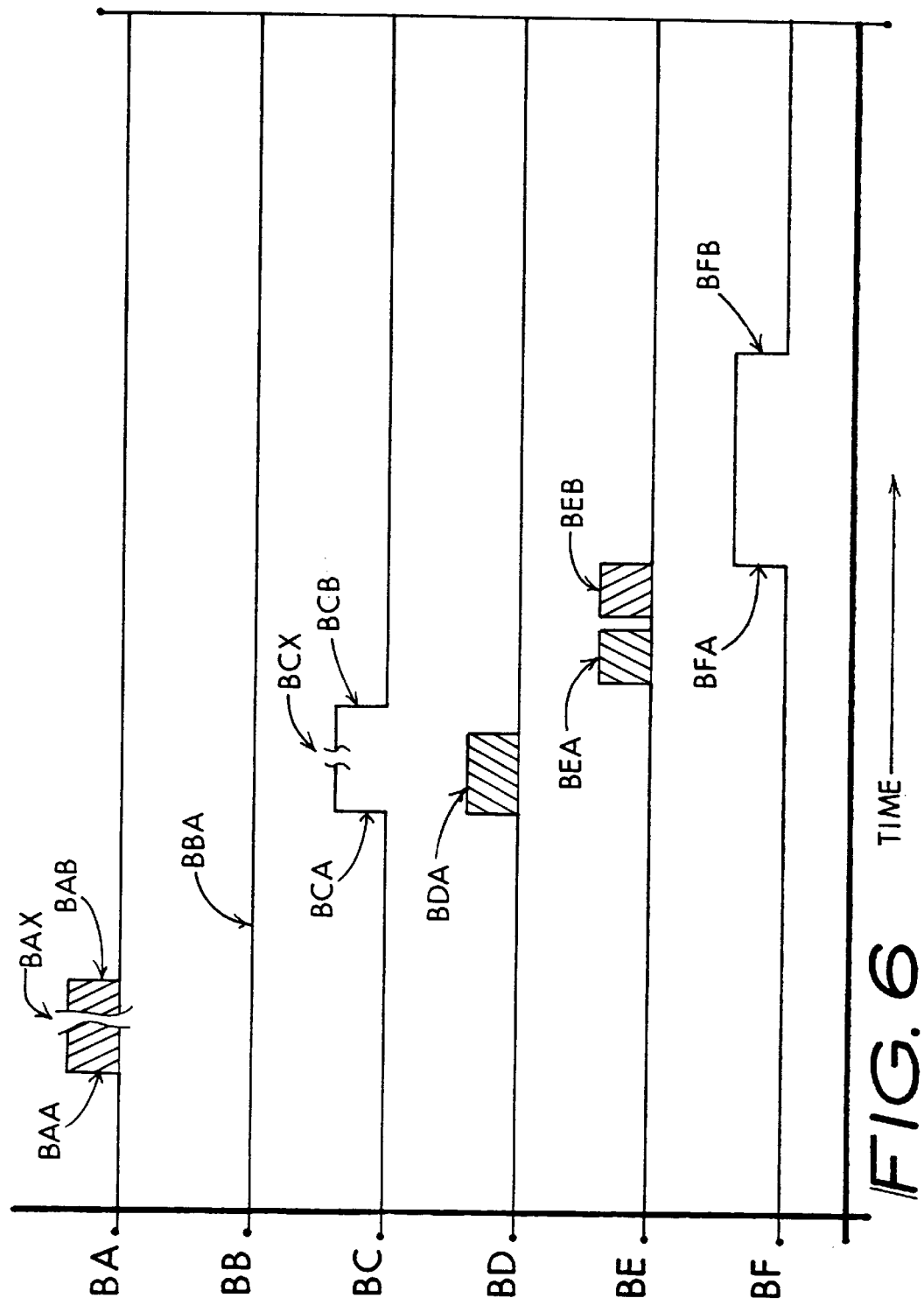

FIG. 6—Timing diagram of entry and signal dispatch events including auto-completion of leading zero for single digit channel selection.

Figure 7:
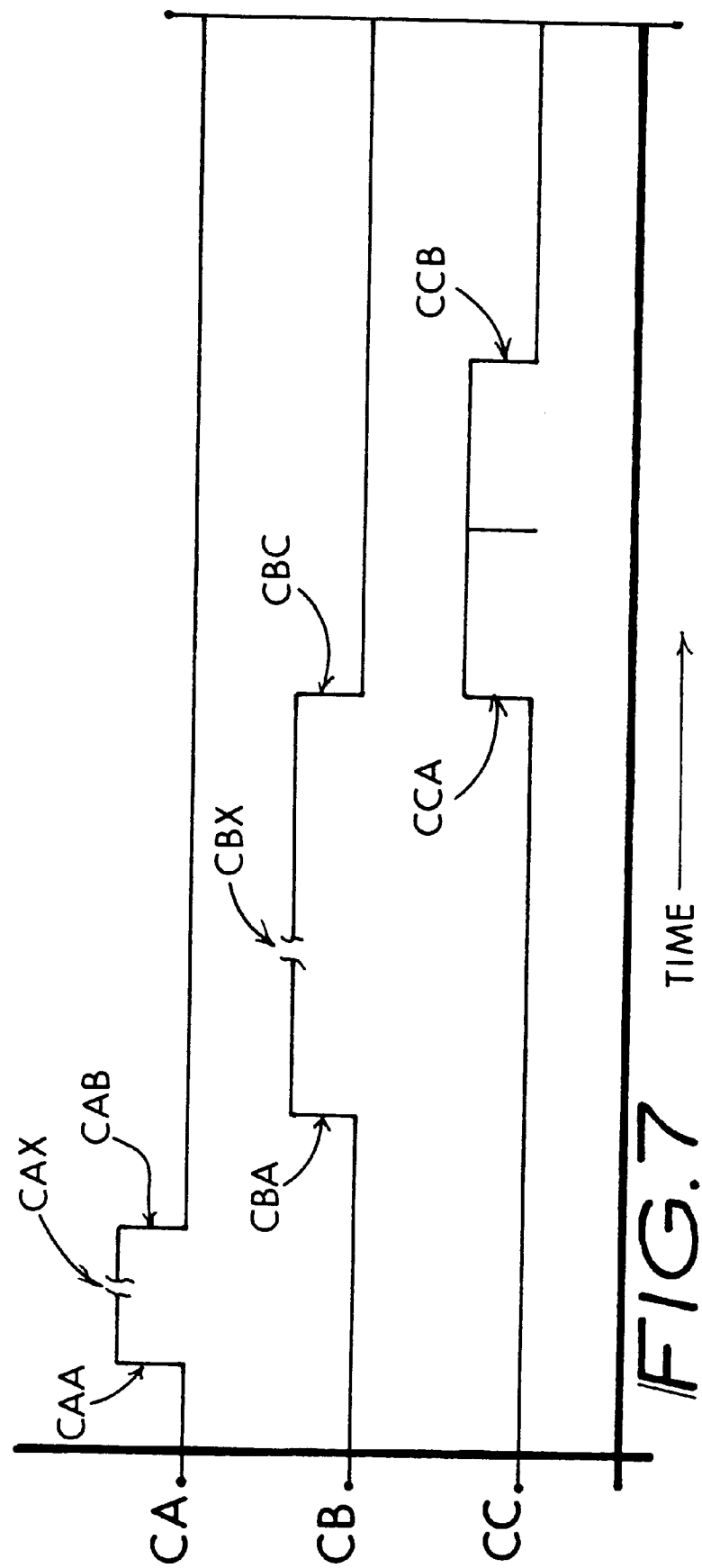

FIG. 7—Timing diagram showing signal dispatch to occur upon release of second entry key.

Figure 8:
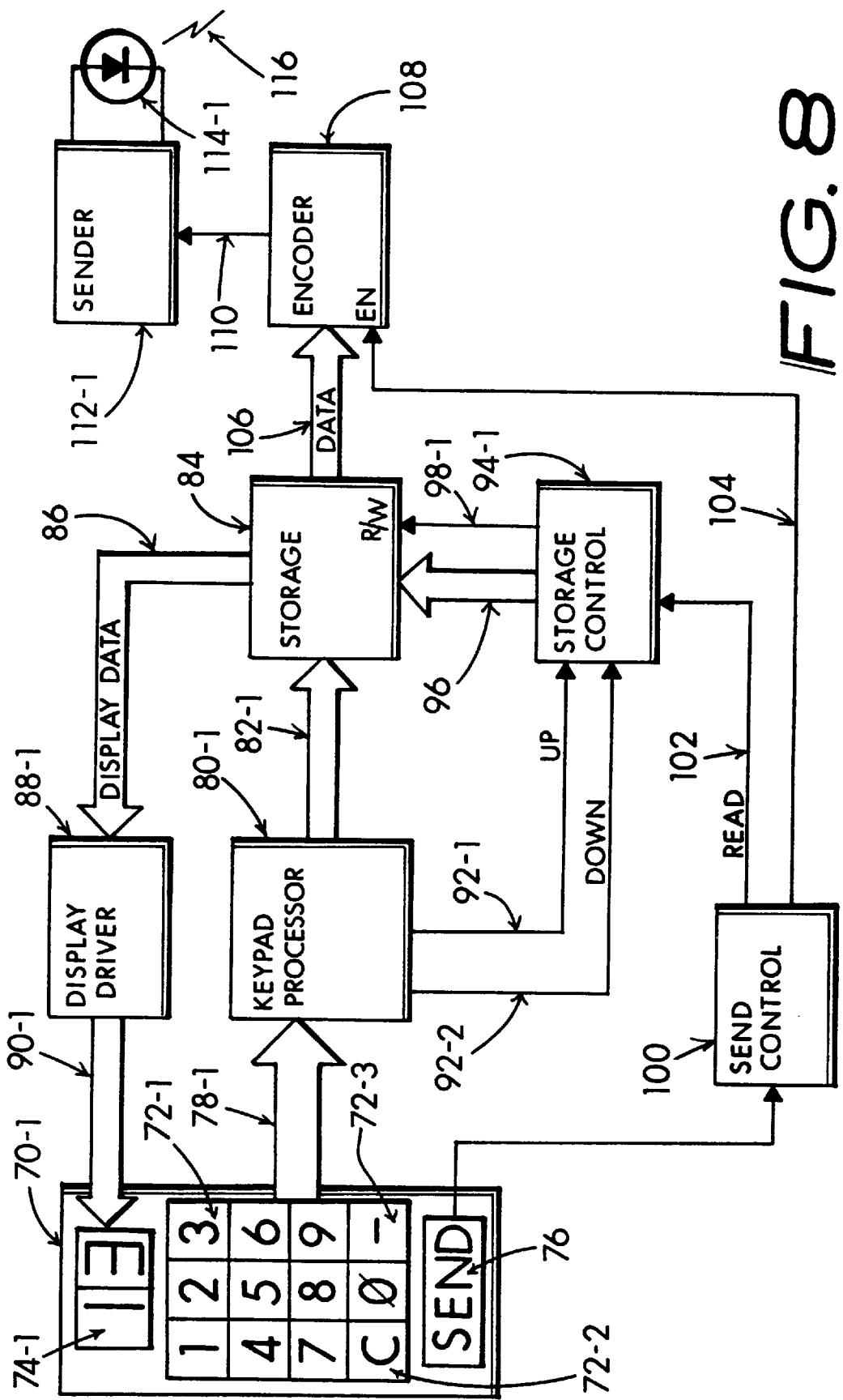

FIG. 8—Block diagram showing elements of a fundamental remote controller incorporating my invention.

Figure 9:
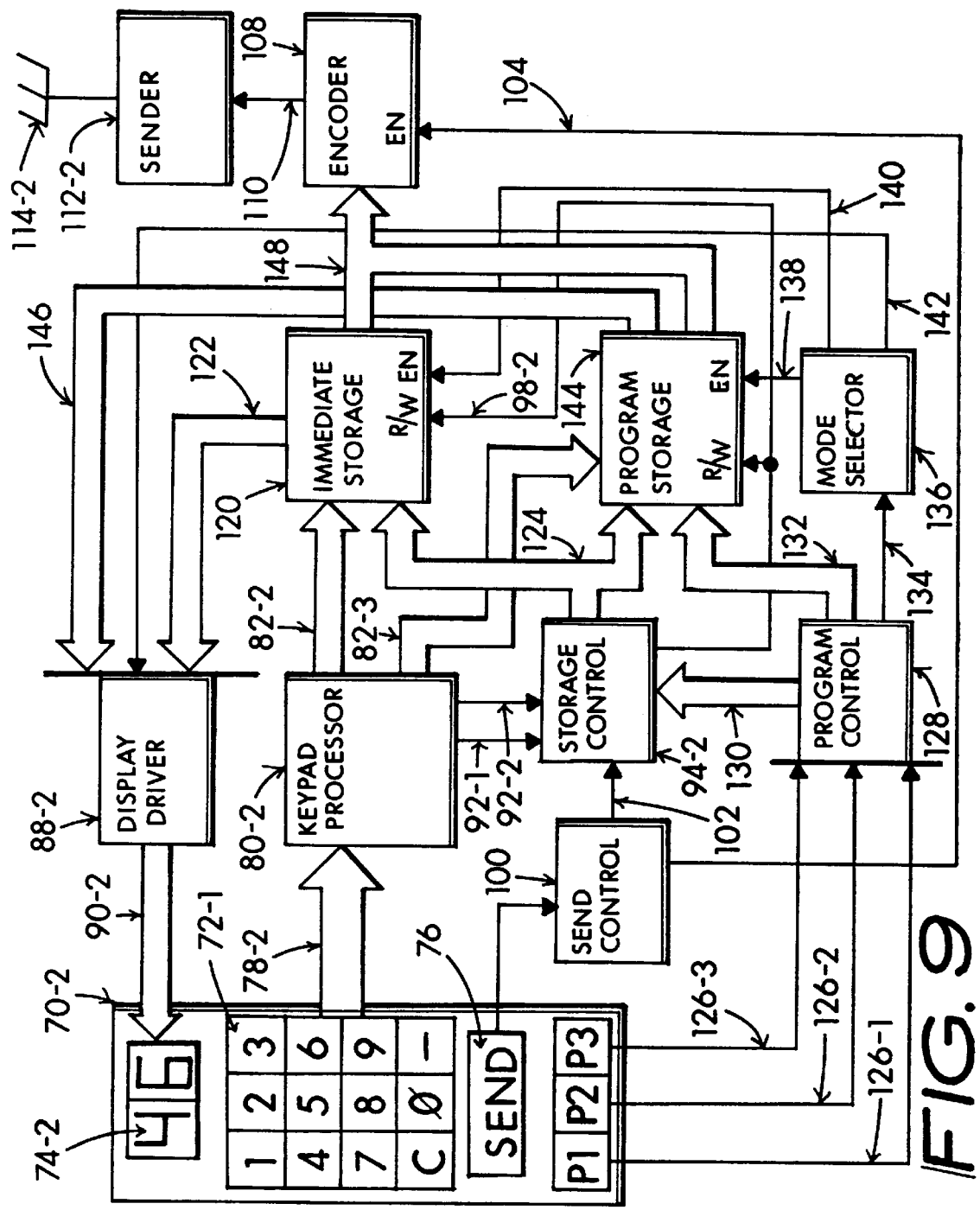

FIG. 9—Block diagram showing remote controller having preset selection capability.

Figure 10:
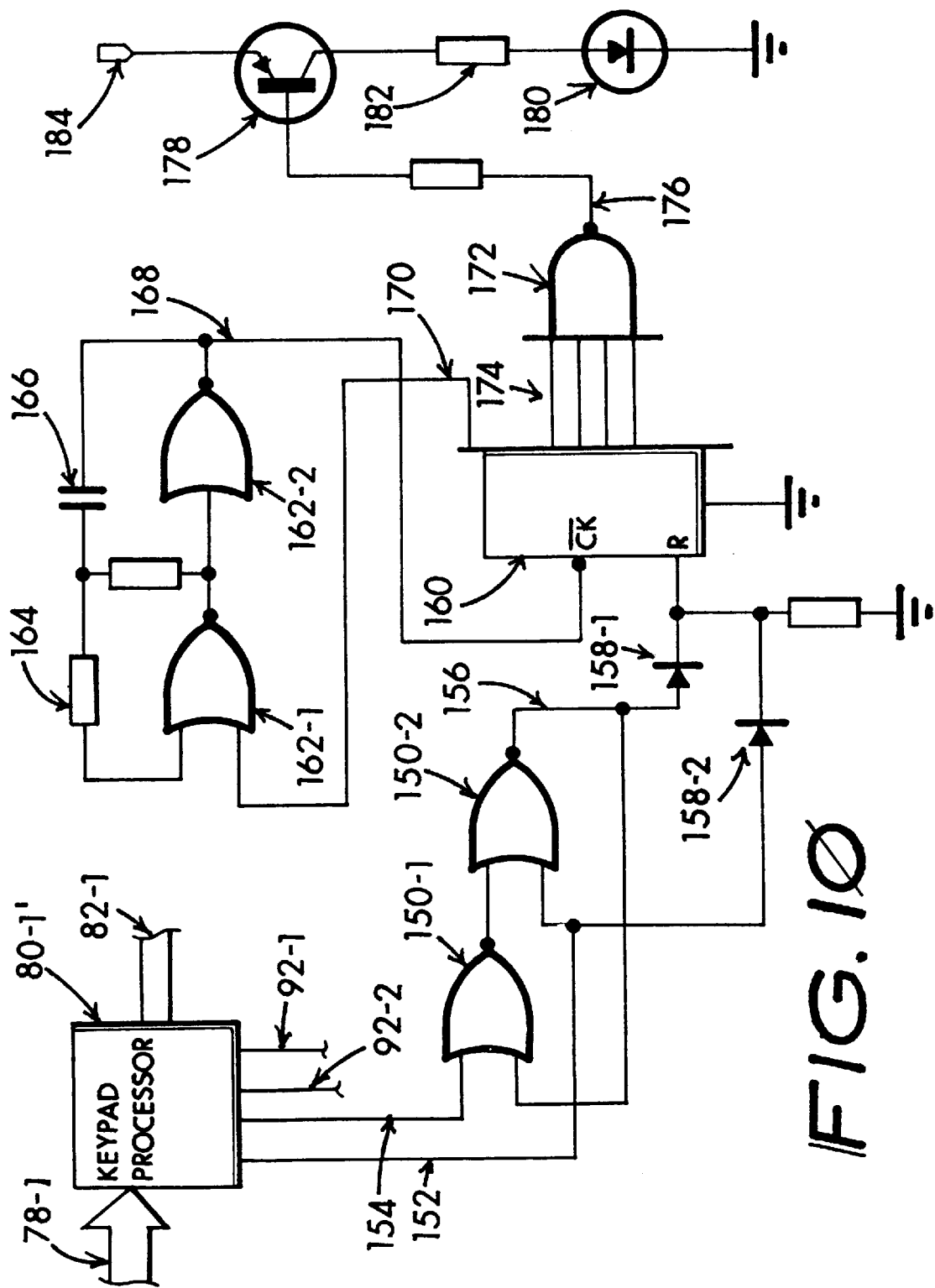

FIG. 10—Representative schematic of visible entry telltale.

Figure 11:
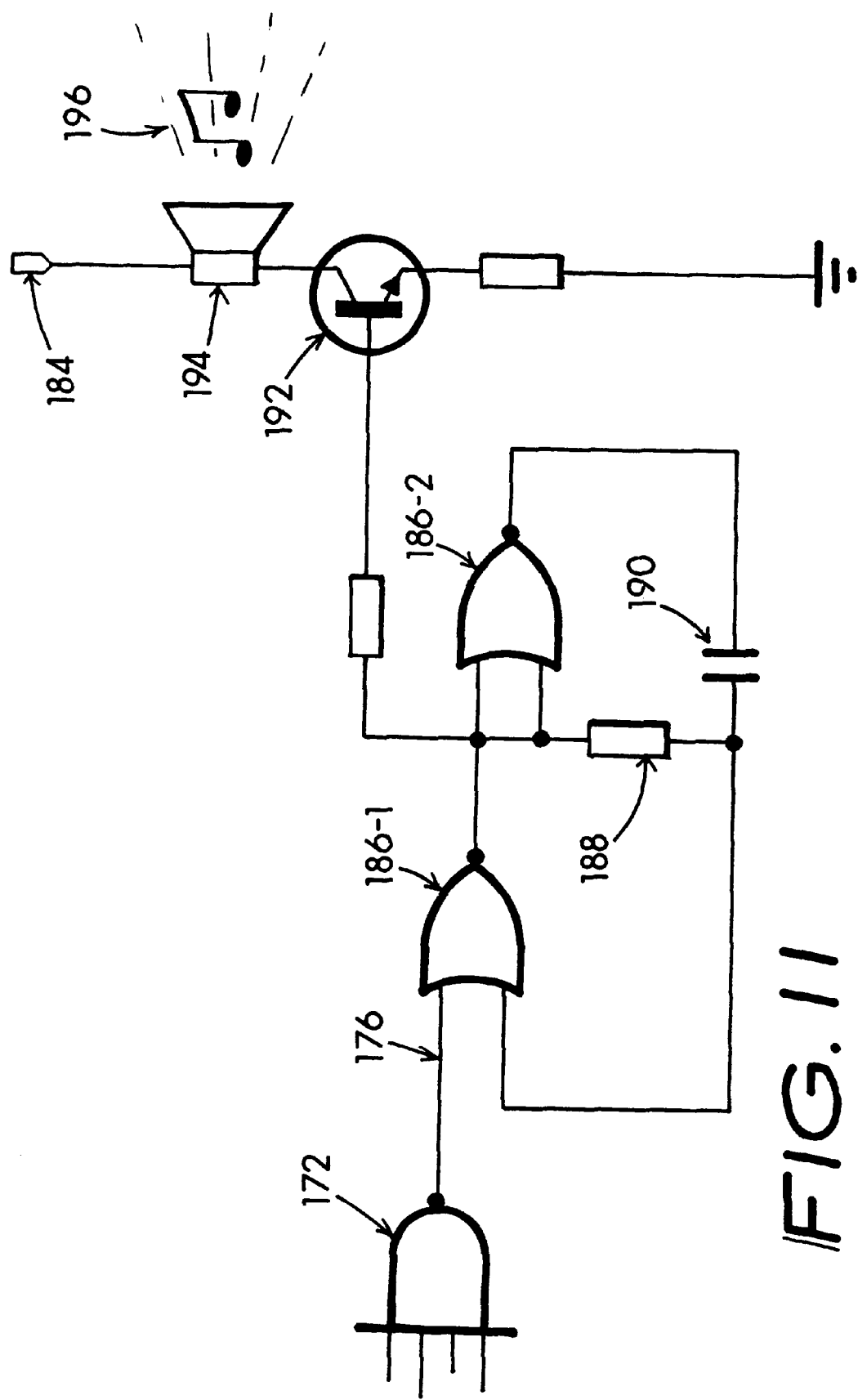

FIG. 11—Representative schematic of audible entry telltale.

Figure 12:
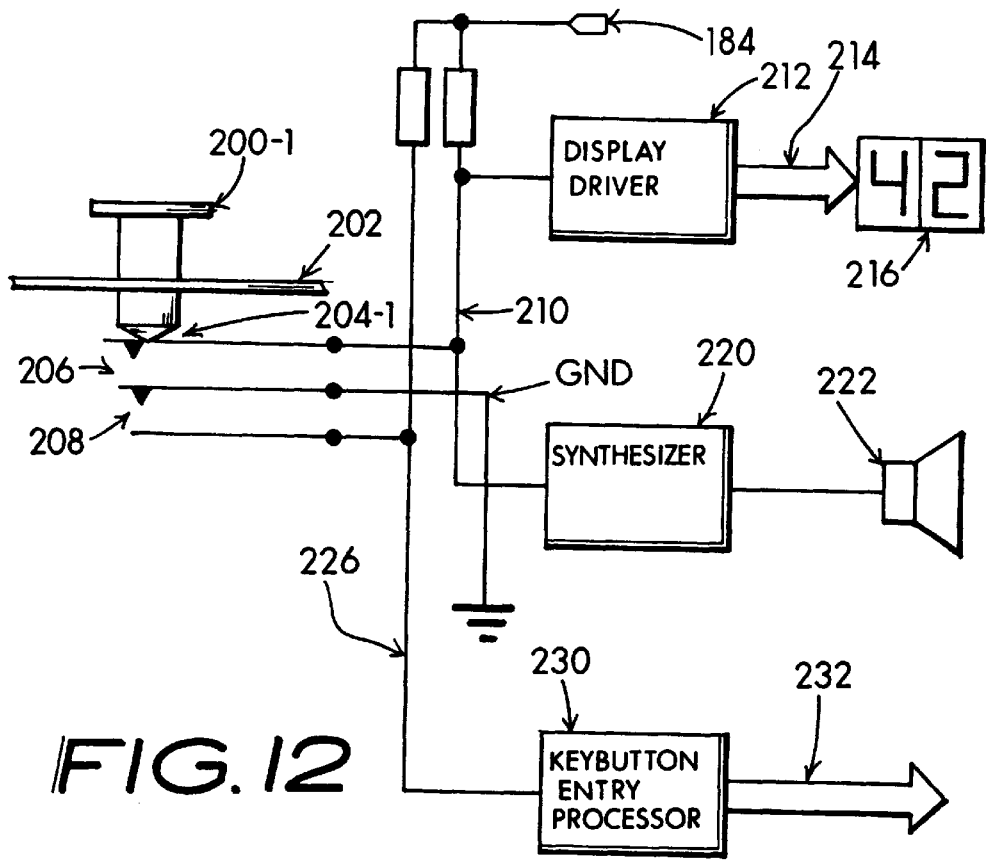

FIG. 12—Progressive keybutton switch in relaxed position.

Figure 13:
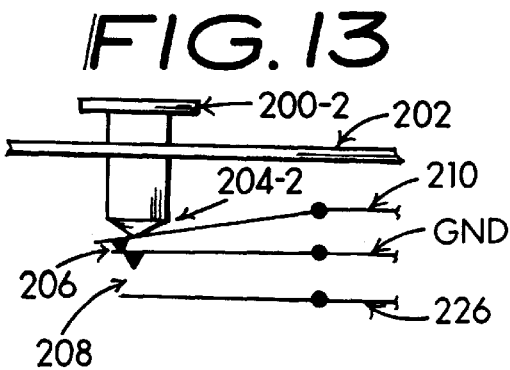

FIG. 13—Progressive keybutton switch in partially actuated state providing audible or visual telltale indicating value of keybutton selection.

Figure 14:
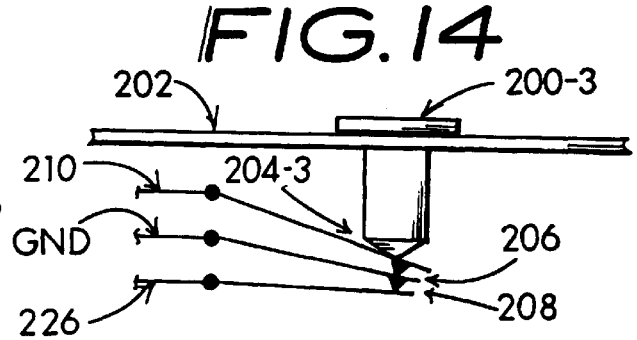

FIG. 14—Progressive keybutton switch in fully actuated state providing keybutton value entry.

Figure 15:
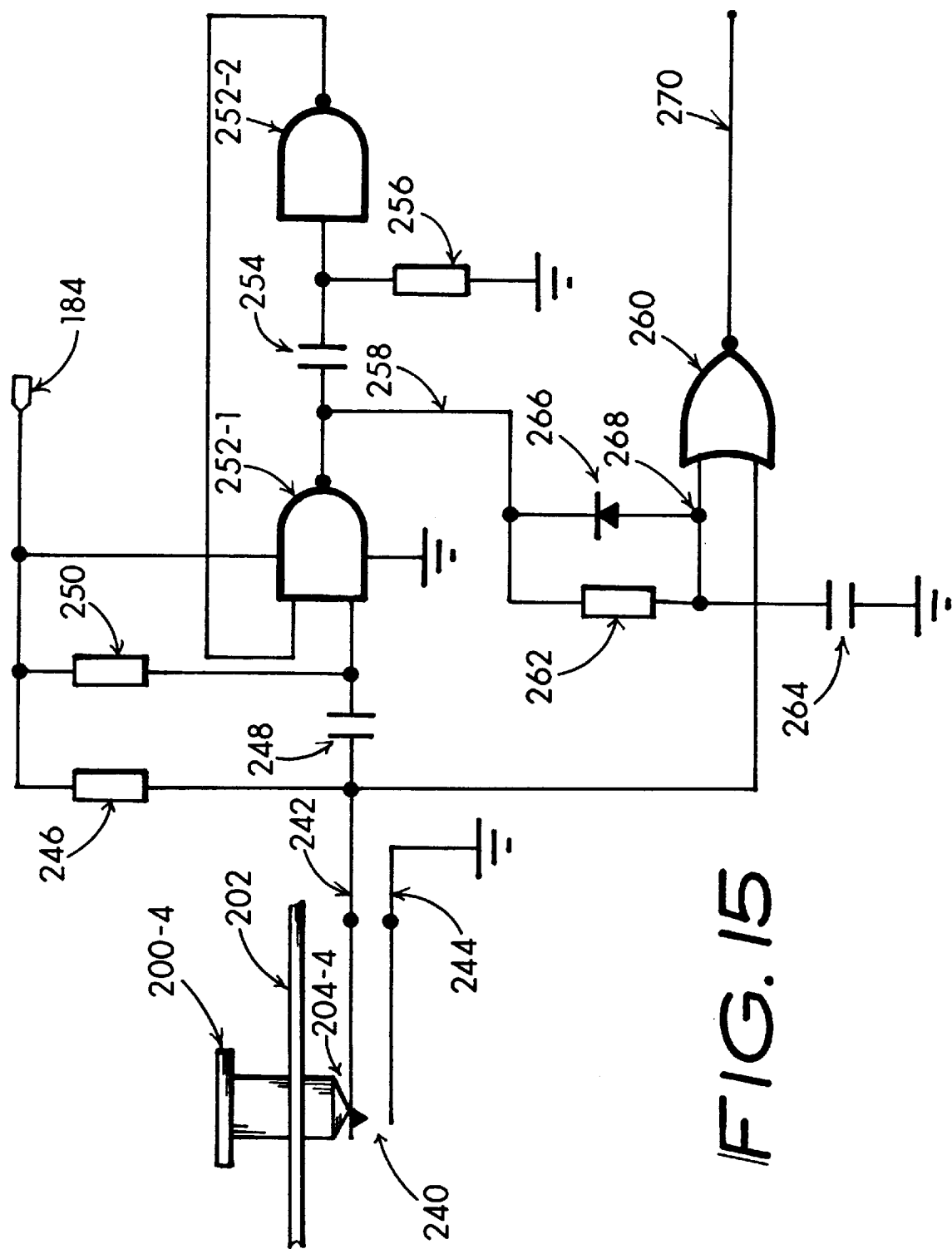

FIG. 15—Filtering keybutton entries to guard against inadvertent repeat entries.

Figure 16:
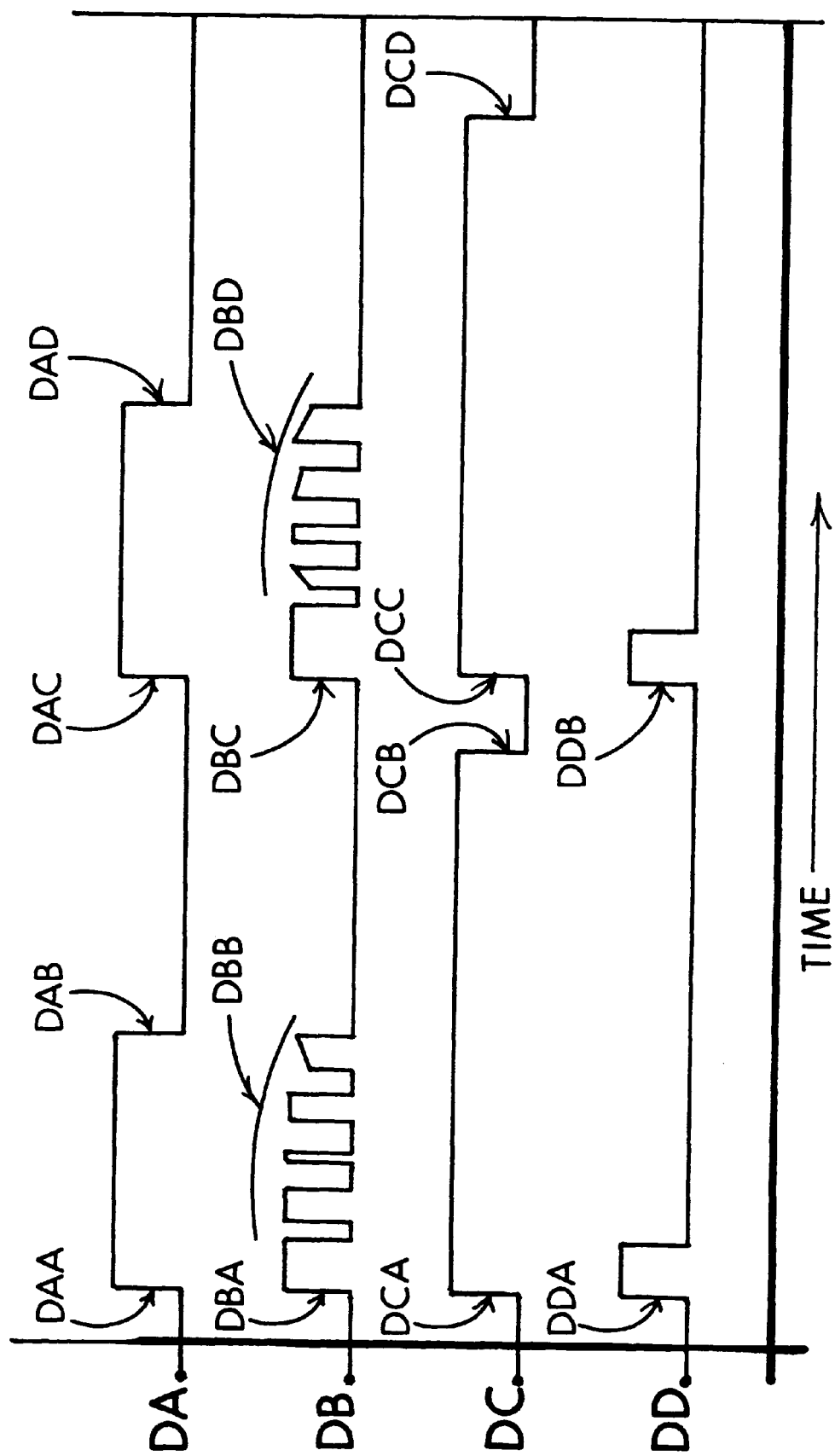

FIG. 16—Timing diagram showing filtering action.

DESCRIPTION OF MY INVENTION

In FIG. 1 I show an overview of my invention 2-1 including its interface between a user 1 and a television set 10 or other remotely controlled apparatus. Observe that the remote controller 2-1 is held in a convenient position which allows keybutton entries to be made, as depicted by action arrow 3 while the user 1 is readily viewing 4 the frontispiece of the controller. This means that the user 1 can leisurely enter his selections using the keybuttons white viewing 4 the entry selections to prevent error and overcome confusion. As a result of this exceptional entry proviso the user 1 may take whatever time is necessary to make the entries without concern for positional location of the remote controller. As a practical example, albeit an extreme example, the entries might be made in another room far away from the controlled device 10. For an everyday example, the entries might be made in a bathroom during station break and then the remote controller may be carried back into the room proximate with the television set 10 and utilized to change channel selection.

Moving the remote controller from the user viewable position is depicted by action arrow 5-1 whereby the remote controller 2-1 is moved to an intermediate position as depicted by the remote controller 2-2 location. An action arrow 5-2 depicts a continued movement to the remote controller 2-3 location. Realize that the depicted remote controllers 2-1,2-2,2-3 are all the same device moved 6 to different operational positions as delineated by the action arrows 5-1,5-2.

The remote controller 2-3 is oriented by the user 1 to obtain coupling 7 with a receptor 9 portion of the controlled apparatus 10 (for example, the depicted television set). As is well known, the wireless coupling between a typical remote controller and the controlled apparatus usually involves an infrared light beam signal which is pulsed with keyed data 8. Ordinarily the light beam is of an approximate conical configuration which splays forth 7 from a sender port situate in a forward facing end structure portion of the remote controller 2-3.

Facing Keypad Eases Entry

What is importantly shown by this FIG. 1 is that initially during the entry phase the remote controller 2-1 is held in a position which places the keypad to be convenient for use by the user, whilst subsequently the sender port on the remote controller is moved to be aligned with the receptor 8 whereupon the previously entered and temporarily stored selections are discharged for dispatch to the remotely controlled device 10.

Look now to FIG. 2 for a flow chart depicting keyboard entries 12 being progressively made. Each entry may flow forth 14 to be displayed 16. Each entry also flows 18 to a "SEND?" decision function 20. A NO entry results in loopback 22 to the keyboard 12. Alternatively, a recognized SEND entry produces a YES coupling on line 24 with a "TWO DIGITS?" query function 26. If only one digit is present when the SEND entry is made, a NO signal on line 28 loops through an "ADD '0' PREFIX" function 30, the purpose for which is to insert a leading zero on the present digit, thereby producing a necessary two-digit composite. For example, if Channel 7 is selected, the value 07 must be sent via the remote controller signal coupling, as is usual practice. However, prior to now the value 0 had to be intentionally entered prior to the channel choice 7. So, simply stated my invention takes the entry seven and modifies it to appear as:

0 and 7 equals 07.

Once two digits are recognized by the decision function 26, whether originally entered as two digits (say channel 36, for example) or modified to including a leading 0 as just described, a two digit signal is delivered on line 34 to the wireless signal sender 36.

In FIG. 3 I show a novel aspect of my invention wherein a remote controller 40 may send forth 42 a signal sequence 44 that may be intercepted by two (or more) remotely controlled apparatus. For example, such apparatus might include various combinations of entertainment devices, such as a television set, cable converter box, VCR, stereo music system, home theater devices and so forth.

Whatever has been "punched into" the associated keypad portion of the remote controller 40 is translated into a first encoded signal portion 46-1 that couples 48 to a first apparatus 50 receptor 52. Subsequent delivery of a second encoded signal portion 54-1 next occurs, thereforth coupling 56 with a second apparatus 58 receptor 60. In a preferred embodiment for my invention, this second encoded signal is preset as a necessitous channel selection for the second apparatus. Commonly, this occurs when the first apparatus is a cable converter box which delivers an intermediate (or sub-band) signal on channel 3 or channel 4. As a result the second apparatus is the television set which must be unconditionally set to a corresponding channel 3 or channel 4. In everyday life, what happens is that often the television set inadvertently gets mistakenly reset to a wrong channel (maybe an adjacent channel 2 or channel 5) and the cable converter does not appear to work correctly. Therefore, my invention's capability for automatically resetting or reaffirming the necessitous channel 3 or channel 4 selection on the second apparatus affords a far higher degree of satisfactory performance than that which heretofore has been achieved in the art.

In FIG. 4 I depict a similar sort of multi-device coupling with the illustrative objective of showing that the relational sequence for the encoded signal may assume a different time relationship without upsetting the philosophical operability of my invention. In other words, the sequence of the encoded signals 46-2,54-2 of FIG. 4 are opposite that of the sequential timing of the encoded signals 46-1,54-1 of earlier FIG. 3.

A timing diagram shown in FIG. 5 depicts various functional events for my invention. Time-line AA events AAA, AAB show an occurrence of a FIRST keybutton entry in a sequence of entries. Ordinarily, this keybutton entry may assume any value between 0 and 9. The broken region AAX denotes that the keybutton time duration may be of various lengths, e.g., very short or very long. Conceivably, the duration could be minutes or even hours, although there is no clear reason to assume this would ordinarily occur in my invention's usage.

A SECOND keybutton entry event appears on the time-line BA, having a duration ABA,ABB which may also vary in time ABX.

Following the two entries, a user may initiate a SEND entry shown on time-line AC, having a duration ACA,ACB which may also vary in time ACX.

An immediate encoded signal dispatch may occur, as shown on time-line AD which initiates ADA concurrently with the initiating of the SEND command ACA. The encoded signal resultingly sends a control signal to the remotely controlled device, completing ADB upon fulfillment of the encoded signal format.

Dispatch of the encoded signal may be retarded as shown on time-line AE to initiate AEA upon completion of the SEND entry ACB. An advantage of this mode of operation is that the SEND keybutton may be depressed and held-down while the remote controller 2-1 of FIG. 1 is brought into alignment with the receptor 9 as depicted by the remote controller 2-3 position. Once alignment is achieved, the SEND button is released and the trailing edge ACB of the SEND command pulse triggers sending of the encoded signal for the signal format duration AEA,AEB.

Release "Send" Keybutton to Dispatch Signal

A noteworthy aspect of this operation is to understand that it is easier to press-down on the SEND button when the keyboard is viewable and to hold that pressed-down state, whereupon only a release or withdrawal of a finger from the keybutton is needed when signal coupling alignment is achieved. This should be compared to locating the SEND keybutton when it is obscured after necessitous alignment is accomplished.

Time Delay After Pressing Send Keybutton

Similarly, a time delay between consummating the SEND command and actually sending the encoded signal may suffice to provide a desired level of convenience for operation. Time-line AF depicts a dispatch of the encoded signal pulse which occurs subsequent to either an elapse of time ACC which may occur between the leading edge ACA of the SEND pulse and the time event line ACY that coincides with a leading edge AFA of the encoded signal pulse appearing on time line AF; or alternatively, an elapse of time ACD which may occur between the trailing edge ACB of the SEND pulse and the time event line ACY. As a result, the encoded signal which occurs on time line AF during the pulse period defined between AFA, AFB may develop, for example, about 5 seconds after pressing the SEND keybutton thereby giving the user 1 sufficient time to realign the remote controller with a receptor on the controlled device.

Automatic Leading-Zero Inclusion

Autocompletion of a channel selection sequence is depicted in FIG. 6. It is well known that any selection of a single-digit channel number of 2 through 9 (with 1 not being used) necessitates a prefix value of 0 being firstly selected. With television signal tuning apparatus of ordinary construction (e.g., TV-tuners) a failure to insert the leading zero results in an incomplete command and the TV tuner simply does not change channels, but usually remains on the presently selected channel. Confusion abounds, because sometimes a user will punch-in 6 intending to change to channel 6 whereupon he remembers that he needs to have first entered a zero to make it work. In a frustrated move, the same user may then punch in a 0 attempting to repeat the entry process, his goal being to press 0 and 6. However, the simple mind of the ordinary remote controller recognizes the 0 entry as a completion of the earlier set digit of 6. The result is the encoded value 60 is dispatched to the TV-tuner and, guess what, the TV-tuner is set to channel 60 and not the desired channel 6.

With my invention, this sort of annoying performance is a matter of history. As I show in FIG. 6, a first keybutton entry shown on time-line BA may alone be used to enter the mentioned choice of a single digit channel 6. The keybutton entry duration BAA,BAB may assume variable length BAX, as said before. Time-line BB illustratively shows that NO second keybutton entry is made. The first keybutton entry value (of 6) stands alone, whereafter the SEND keybutton may be pressed as depicted on time-line BC, having a duration BCA,BCB which also may be variable BCX in duration.

On a time-line BD I depict a leading zero component BDA being produced as a result of the SEND command pulse appearing on time line BC and a recognition that no second keybutton entry as shown on time line BB has been made. As a result the leading zero signal BDA is inserted on time-line BE as a pulse signal BEA which precedes the channel selection data pulse BEB defined by the first keybutton entry on time line BA.

The combined leading zero and channel selection signal pulses BEA,BEB are then dispatched as shown on time line BF by a wireless signal having an intelligence bearing duration BFA,BFB. Realize that the wireless signal transmission may also be delayed as said for FIG. 5, through the step of initiating upon the trailing edge BCB of the SEND pulse as more clearly said for the relationship between the send pulse shown on time line AC and encoded signal transmission shown on time line AE of FIG. 5, or by the step of delaying the production of the wireless pulse as earlier said for the signal shown on time line AF relationship of the encoded relative with the SEND keybutton activation shown on time line AC of FIG. 5.

Send Command Initiates Upon Release of Second Entry Keybutton

In FIG. 7 I depict a first keybutton entry shown on time line CA, for example a numerical value of 2 producing a pulse having a variable duration CAX between level shifts CAA,CAB. Subsequently, a second keybutton entry shown on time line CB might be made, with an example value of 5. This second entry extends between level shifts CBA,CBB having an extended, albeit variable, duration of CBX. When the second keybutton is released, developing the trailing edge CBB, an encoded signal is dispatched by the remote controller to a remotely controlled device. This encoded signal dispatch is shown on time line CC, depicted as a wireless signal pulse having a duration CCA,CCB.

Of urgent notice for this illustrative depiction is the ability to hold the second entry CBX for any reasonable period of time, with seconds or even conceivably minutes elapsing between the onset of the pulse CBA when the keybutton is first pressed and the completion of the pulse CBB when the keybutton is released. What this shows is that the second entry keybutton can be used as a delaying device to retard actual transmission of the encoded signal dispatch until the user is good-and-ready to proceed. This enables the user to hold the remote controller in a conveniently viewable position as entries are made, then move the remote controller in alignment with the remotely controlled device's receptor and subsequently send the command signal simply by releasing the held-down keybutton.

Entry Errors May Be In Situ Corrected

With FIG. 8 I show a typically hand-held remote controller 70-1 to include a keypad 72-1 typically including the numerical digits 1–9,0 and preferably a — (or backspace) keybutton and a clear (C) keybutton. A digital display 74-1 may show entries made through the keypad. A SEND keybutton 76 provides the SEND earlier mentioned command function.

Keypad signals couple via a bus 78-1 with a keypad processor 80-1 to produce data signals on bus 82-1 weighted to represent each keybutton action. The keypad data signals 82-1 couple with a data input port of a storage device 84, which may be adapted from a shift register or a random access memory (RAM). Data read into the storage device 84 is ported over a display bus 86 and through a display driver 88-1 to drive 90-1 the mentioned digital display 74-1.

Observe that the keypad processor may develop UP and DOWN signals on lines 92-1,92-2 which increment a storage control device (such as a shift register controller or a counter for advancing a RAM's address). As a result, each entry into a keybutton on the keypad 72-1 produces an UP pulse on the line 92-1 which advances the address signal on line 96 for control of the attendant shift register or RAM storage location. Similarly, a — (or backspace) input to the keybutton 72-3 develops a DOWN pulse on line 92-2 which increments the storage location backwards so that it can be overwritten with correct data. This enables a user to correct an erroneous entry before dispatching it to the recipient television set or other device. Throughout my presentation for my invention, I show next channel selection as being a two digit entry. Of course three or more digits may just as well used and it will be obvious to anyone experiencing technical skill in this art-field that adaptation of any portion of my invention's essence to more than two digits is an obvious variation. So, while I talk about 2-digit channel number values, this may include 3-digit channel number values, or values representing some other meaning.

Data stored in the storage device 84 is readable over a data line 106 as coupled with an encoder 108. When the SEND keybutton 76 is pressed by a user, a send control circuit 100 produces a READ signal on line 102 that couples with the storage control circuits 94-1. As a result, the level on line 98-1 is changed from WRITE (which may be LOW) to READ (which may be HIGH) at the R/W input of the storage device 84. An ENABLE signal also develops on line 104 which couples with the encoder 108 to enable data acceptance and conversion into an encoded data signal coupled over line 110 to be translated through the sender 112-1 to excite a wireless coupling device 114-1, such as a laser diode or light emitting diode which is depicted to thereby develop a wireless linking signal 116.

Uniquely Encoded Data Signal Transmissions

The encoder 108 performs not only conversion of the data on the data bus 106 into a modulated format for transmission, but it also specially encodes the data translation as a packet of uniquely encoded sequence of data bits which can ordinarily only be recognized by a remotely controlled apparatus having a receptor uniquely keyed to match the encoding pattern. Motorola for example provides the MC145026P integrated circuit (CMOS Remote Control Encoder) which suffices for this application. Many other equivalent devices are known in the field, having been used in virtually every handheld remote control device built within the past decade or so, including those for television channel selection as well as for the now well-known "X-10 standard" of home control devices, such as made by Leviton Mfg. Co., Inc., Stanley Toolworks, Inc. and others.

Selection of Present Channels

In FIG. 9 I depict a handheld remote controller 70-2 having the arrangement of keypad 72-2, digital display 74-2 and SEND keybutton 76. In addition, I show several additional keybuttons P1,P2,P3 which serve as presets for a user's preselection of preferred channel number selections.

Keypad data couples via bus 78-2 with a keypad processor 80-2 to develop keybutton actuation data on data bus 82-2 that couples with an immediate storage device 120 and on data bus 82-3 that couples with a program storage device 144.

The storage control 94-2 produces an address signal on line 124 which may increment locations of the immediate storage device 120 and the program storage device 144.

In a modeled version of this embodiment, I have found that a sequence where pressing and holding any one of the preset keys P1,P2 or P3 may be utilized to set-up the users choice of channel selection data. More specifically, if the keybutton P1 is maintained depressed, two numerical entries are made through the keypad 72-2 and then the SEND keybutton 76 is pressed, the two-digit selected entry may be stored in the program storage device 144 for later retrieval merely by pressing the keybutton marked P1.

How this occurs is that, when the keybutton P1 is maintained the program control 128 instructs the storage control 94-2 to address the P1 location in the program storage memory 144.

Pressing the SEND keybutton 76 then delivers necessitous signals from the send control 100 via line 102 to the storage control 94-2 which instruct the storage control 94-2 to establish a WRITE level on line 98-2 as coupled with the program storage 144. The result is that data appearing on bus 82-3, having been entered through numerical keybutton selection on the keypad 72-2 are written into the program storage 144.

The program control also introduces two further signals. A display control signal on line 142 (exampled as a 2-bit data line) serves to delineate display operation in accord with the following table (by way of example):

| LINE 142 LOGIC | | DISPLAY |
| --- | --- | --- |
| A | B | MODE |
| 0 | 0 | IMMEDIATE (Keypad Entries) |
| 0 | 1 | PROGRAM P1 Entries |
| 1 | 0 | PROGRAM P2 Entries |
| 1 | 1 | PROGRAM P3 Entries |

A control signal on line 140 serves to disable the immediate storage 120 whenever the program storage 144 is utilized. Depending upon modal selection which has been established through the display driver, display data introduced over bus 122 from the immediate storage 120 or over bus 146 from the program storage 144 is visually depicted on the display 74-2.

Each the immediate storage 120 and the program storage 144 deliver channel selection (and other) data signals over the data bus 148 as coupled with a data input of the encoder 108. The encoder delivers an encoded data signal with a sender 112-2 which may drive an antenna 114-2 or other wireless transmission device to effect coupling with the intended recipient remotely controlled device, such as the television set 10 of FIG. 1.

Visual Telltale

An periodic blink of a light emitting diode indicating that an entry sequence has been undertaken is provided by my circuit of FIG. 10. A keypad processor 80-1' shown earlier in FIG. 8 provides two additional signals on lines 152,154. A HIGH state numerical keybutton entry pulse signal appears on line 152 whenever a number key is pressed on the keypad 72-1. Two NOR gates 150-1,150-2 are crosscoupled as a bistable latch. The HIGH state pulse signal coupled on line 152 with the NOR gate 150-2 serves to SET the latch, producing a LOW state on line 156 that couples with a reset input of a counter device 160, such as a well known CMOS type CD4020BE (a 14-stage counter).

Two NOR gates 162-1,162-2 are cross coupled to produce clocking pulses on line 168 which couple with the ICK input of the counter 160. The oscillatory rate of the configuration is determined by the time constants of the resistor 164 and capacitor 166 in accord with well known practice.

When the level on line 156 is LOW, as set by introduction of a number keybutton actuation, the counter advances states and whenever an all HIGH state briefly recurs on the lines 174 coupled with a NAND gate 172, a LOW state pulse occurs on line 176 that couples with a base element of a PNP transistor 178. A result is that current delivered by a source of +DC power coupled with terminal 184 is caused to flow through a light emitting diode 180 and ballast resistor 182. This overall connection produces a periodic blinking of the lamp 180, the rate of which is determined by the clock frequency rate on line 168.

After achieving a predetermined number of counts, the counters highest bit output (output line Q14 in the case of a CD4020BE device) is driven HIGH with the result that the goes HIGH as coupled with an input of the NOR gate 162-1. As a result, the oscillator is inhibited and line 168 is simply driven HIGH where it remains. This action (which may be optional) overcomes an indefinite blinking telltale if the remote controller is laid aside or forgotten. It is essentially an autoshutdown feature for the telltale. Quite obviously a next entry of a numerical keybutton selection that delivers a HIGH state pulse signal on line 152 may also couple through a steering diode 158-2 to momentarily reset the counter 160 and allow the telltale action to resume until the SEND keybutton signal on line 154 resets the latch, delivering a steady HIGH state through the diode 158-1 and maintaining the reset state of the counter 160 and thereby inhibiting the telltale action.

Audible Telltale as Periodic Beep

The periodic pulse developed on line 176 as shown in FIG. 10 may be utilized in the hookup of FIG. 11 to produce an audible beep instead of (or in conjunction with) the blinking of the light 180. The LOW state pulse on line 176 enables a multivibrator oscillator including crosscoupled NOR gates 186-1,186-2, resistor 188 and capacitor 190. Determination of the resistor 188 and capacitor 190 values may achieve an audio frequency pulse signal which couples with the base element of an NPN transistor 192. The transistor 192 collector couples through a sounder 194 with the source of +DC power 184. As a result, a periodic beep is delivered 196 by the sounder, typically having a preferred audible rate selected within the range of 1-KHz to 8-KHz (more or less to taste).

Sensory Identification of Selected Keybutton

A keybutton 200-1 shown in FIG. 12 is said to be trilevel or tripositional in operation. That is to say the keybutton 200-1 experiences a possibility for a plurality of states, including:

1. A normal or relaxed position as shown in FIG. 12.
2. A partially depressed position as shown in FIG. 13.
3. A fully depressed position as shown in FIG. 14.

In FIG. 12 the keybutton 200-1 is depicted in a relaxed position relative with a surface plane 202. In this relaxed position, the switch contact arrangement 206 and the switch contact arrangement 208 are both in an open state. The result is that since the middle arm of the progressive switch set is grounded (GND) or logic LOW, each of the other switch contacts which couple via lines 210 and 226 are drawn to a HIGH state through pull-up resistors coupled with a source of HIGH state or +DC power 184.

Line 210 is coupled with a display driver 212 that couples 214 with a visual display 216. The line 210 is also coupled with a synthesizer 220 and a sounder 222 which may reproduce a synthesized voice replication of numerical values. Line 226 subsequently couples with a keybutton entry processor, a circuit arrangement which assigns binary weight to each selected keybutton for delivery on line 232. Typically, the keybutton entry processor 230 may be incorporated as a portion of the keyboard processor 80-1 of FIG. 8.

When the keybutton 200-2 is partially depressed by finger pressure as shown in FIG. 13, the uppermost switch contacts 206 close, causing the signal on line 210 to assume a LOW state since it returns to ground through the GND contact. This low state cooperates with the display driver 212 to deliver an indicative set of data on bus 214 to the display 216 to indicate the entry. The low state also delivers to a unique input of the synthesizer 220 to enable a voicing of a representation of the keybutton's numerical value through the sounder 222.

At this point the user may confirm correctness of the partially depressed key's choice. If the user wants to enter 5, and the display or the sounder gives indication of 5 then the user may fully depress the keybutton 200-3 as shown in FIG. 14. As a result, the contact set 208 is closed and line 226 is drawn low. This sends a unique keybutton selection signal to the keybutton entry processor 230 and a binary weighted signal flows forth on data line 232.

On the other hand, if the user wants to enter 5, and the display or the sounder gives indication of something other than 5 (for example 6) then the user may simply release the keybutton 200-2 to assume an initial state as shown by keybutton 200-1 in FIG. 12. Since no completion was obtained and the contact set 208 never was closed, no false data signal is introduced on the data line 232.

Keystroke Filtering to Deny Multiple Entry Error

Filtering of keystroke action is my object for depicting the configuration of FIG. 15. Multiple entries of an individual keybutton can occur when operated by a user having a nervous malady such as shaking palsy, age-related tremors and similar symptoms. It is not uncommon for elderly persons to experience such a problem with the result that errors are introduced. It is common practice to make keybutton action "stiff", with a relatively high actuation pressure needed to obtain an entry. This practice is unfortunately contrary to the needs of a vast portion of television set users who are elderly, or otherwise physically feeble. Therefore, reducing keystroke pressure is a benefit to such users, but it also increases the likelihood for inadvertent multiple entries.

Multiple Entries Are Not Contact Bounce

Contact bounce related to switch contact closure operated by a keybutton or otherwise is a well understood fault which has been long-resolved in various ways throughout the literature of mechanical switching devices, such as movable contact sets. My invention intends to focus not on the old art of ordinary contact bounce, but rather on the problematic issue of inadvertent multiple entries which may appear to be legitimate and distinctly separate entries, but in reality are not. The cause for such multiple entries are manifold, but for purpose of a suitable discussion the issue of multiple entries introduced by uncontrolled tremors, such as induced by Parkinson's Disease (shaking palsy) and similar conditions, is singled out. This is not to suggest that other causes may be involved, but tremors are a commonplace malady afflicting many persons in our society.

Looking now at FIG. 15 the keybutton 200-4 interferes 204-4 with a switch contact set 240. Pressing the keybutton 200-4 downward, towards the planar surface 202, serves to urge the contact set 240 to close.

Prior to contact set 240 closure, the level on line 242 is drawn HIGH through a resistor 246 that returns to the +DC source 184. Similarly, the level at the juncture of the capacitor 248 and resistor 250 coupled with an input of a NAND gate 252-1 is drawn HIGH.

Closure of the contact set 240 couples the line 242 to the ground (or LOW) line connection 244. As a result, the HIGH to LOW transition couples through the capacitor 248, momentarily lowering the level on the NAND gate 252-1 input. This serves to trigger the timing action of the one-shot multivibrator configuration, including the NAND gates 252-1,252-2 and the timing capacitor 254 and timing resistor 256. This results in a LOW state on line 258.

At the same instant of contact set 240 closure with the level on line 242 pulled LOW, the NOR gate 260 is allowed to produce a HIGH level pulse on line 270. Why this occurs is because the level found at juncture 268 is initially LOW prior to the contact set 240 closure. Therefore the NOR gate conditions are satisfied, with both inputs LOW and the output HIGH. This is a fleeting moment however, because the HIGH state on line 258 developed by the triggered one-shot serves to charge the capacitor 264 through a resistor 262 and the level found on juncture 268 rises HIGH, thereby upsetting the NOR gate 260 input states and the output line 270 signal returns LOW. By choice of the resistor 262 and the capacitor 264 values, the duration of the output line 270 HIGH state pulse may be defined.

Since the line 258 remains in a HIGH state for a period of time defined by the time constants of the capacitor 254 and resistor 256 of the one-shot, any further contact set 240 repeated closures are simply ignored. I have found the time constant for the capacitor 254 and resistor 256 combination to be satisfactory with about 1–2 seconds of duration, while the time constant of the resistor 262 and capacitor 264 are suitable when defined for about 10–50 milliseconds of duration. When the one-shot timing circuit resets after elapse of the mentioned 1–2 seconds or so, the level on line 258 returns to a LOW state and the capacitor 264 is immediately discharged through a diode 266, returning the level found at juncture 268 to a low state thereby awaiting the next valid keybutton action.

Looking now at FIG. 16 a chart serves to depict the various filtering steps I have found workable. Time-line DA shows the representative keybutton action for near-ideal entry. The first keystroke occurs for an interval defined between the level shifts DAA,DAB while a second keystroke may occur between the level shifts DAC,DAD.

In a more realistic environment, the time-line DB shows the keystrokes being initiated DBA,DBC which may include immediate closure of the contact set 240. However, for any of a variety of reasons the contact set closure may not be perfect, but rather a succession of irregular closures DBB, DBD much like well known contact bounce. This may be further aggravated by multiple minor and erratic partial depressions of the keybutton 200-4 due to a user having a nervous malady such as tremors. As a result the signal on time-line DB is all but perfectly formed, rather being a succession of minor partial closures any one of which might ordinarily trigger multiple false entries. The blocking signal on line 258 produced by the one-shot timer is depicted on the time-line DC to include two successive time interval pulses having similar durations of DCA through DCB and DCC through DCD. Each timing interval is initiated by the leading edge closure DBA,DBC of the contact set 240.

The clean keybutton data signal shown on time-line DD is delivered on line 270 and its duration is defined by the single pulse filtering or limiting action introduced by the NOR gate 260 of FIG. 15.

OTHER EMBODIMENTS MAY BE DEVELOPED BY OTHERS

I teach several forms for my novel remote controller invention, as depicted in the sixteen drawing figures and accompanying description. By no means shall details of my teaching be construed as limiting the scope of my invention to a particular combination of elements or structural configurations. The utter essence of my invention is to teach a wireless remote controller device which includes a plethora of here-to-fore unavailable features which contribute to accuracy and operational convenience for channel selection on a remotely controlled TV-set, VCR, cable controller, and satellite converter particularly when used by physically challenged and elderly users. I proceed to give example of apparatus found to be particularly suitable for embodiment of the anti-tremor and hesitancy confirmation methods which might be suitable for enabling a person experiencing difficulty in achieving quick response actions to use the remote controller apparatus of this invention.

The apparatus embodying my methods is also taught to show other operational and interface novelty which empowers persons having vision difficulty, arthritis, and myriad other response limiting conditions to be able to utilize the remote controller's array of features without forfeiting personal independence. It is necessary to realize that approaches which I describe as illustrative to overcome multiple erroneous entries caused by tremoring limbs, mistaken entries caused by poor vision, and mistakes made through short term memory failure might be embodied to take other forms which can be engineered to best satisfy a particular application or take advantage of different technological parts or techniques without departing from the underlying spirit of my invention.

It is also necessary that, when I give exampler of specific operating conditions for the representative operation of circuitry associated with my remote controller apparatus or when I call for particular components or operating values, it shall be clearly realized that these definitions are merely to serve an artisan as guidelines which may assist in explaining the art advancements which I have developed. These guidelines must not be construed as limiting or regulatory regarding any specific configuration or operative methodology of my invention. At most, my teaching should be understood as providing broad illustrative examples which I have found suitable in several forms of my invention and which are presently introduced to convey a more comprehensive understanding of my invention's underlying objectives.

What is claimed is:

1. A portable remote controller method for establishing operational wireless control of a first remotely controlled television signal tuning apparatus, comprising steps of:

defining a NEXT channel selection preference for the first remotely controlled television signal tuning apparatus;

manually introducing a succession of first keypad entries representing the NEXT channel selection preference;

storing a set of first data values representing the manually introduced said NEXT channel selection preference in a first local register portion of the portable remote controller;

manually orienting the portable remote controller device subsequent to a completion of the plurality of first keypad entries to thereby establish a wireless signal coupling path between the portable remote controller and the first remotely controlled television signal tuning apparatus;

manually initiating a SEND command;

first reading the set of first data values representing the NEXT channel selection preference stored in the first local register;

dispatching the first read said set of first data values via the established said wireless signal coupling path; and, setting the first remotely controlled television signal tuning apparatus to the NEXT channel selection preference.

2. The wireless remote controller method of claim 1 comprising further steps of:

assigning the plurality of first keypad entries to include an intended actuation of at least one of a set of numerical keybuttons on the keypad for an usual purpose of entering NEXT channel selection data;

maintaining the intended actuation of a last-actuated said numerical keybutton comprising a last portion of a numerical sequence representing the NEXT channel selection data;

releasing the maintained said numerical keybutton subsequent to the establishment of the wireless signal coupling path; and, recognizing the release of the maintained said numerical keybutton to said manually initiate the SEND command.

3. The wireless remote controller method of claim 1 comprising a further step of visually displaying the stored said set of first data values on a digital display portion of the portable remote controller, thereby enabling a visual verification of keypad entry values.

4. The wireless remote controller method of claim 1 comprising a further step of voice synthesizing the stored said set of first data values into an audible annunciation, thereby enabling an audible verification of keypad entry values particularly for a vision impaired user.

5. The wireless remote controller method of claim 1 comprising further steps of:

manually actuating a SEND keybutton to initiate the SEND command; and, delaying the dispatch of the wireless coupling signal for a predetermined first period of time subsequent to the actuation of the SEND keybutton;

thereby allowing an occurrence of a finite time lapse to enable a user to said manually orient the portable remote controller device prior to the dispatch.

6. The wireless remote controller method of claim 1 comprising further steps of:

manually actuating a SEND keybutton to initiate the send command; and, delaying the dispatch of the wireless coupling until a release of the manually actuated said SEND keybutton occurs;

thereby allowing an occurrence of a finite time lapse to enable a user to said manually orient the portable remote controller device prior to the dispatch.

7. The wireless remote controller method of claim 1 comprising further steps of:

storing a preset selection of second data values representing necessitous channel selection data ordinarily determined as one of channel 3 and channel 4 in a nonvolatile memory;

ordinarily determined as one of channel 3 and channel 4;

second reading the second data values; and, sequentially sending said stored first data values and said second data values via the wireless coupling signal.

8. The wireless remote controller method of claim 7 comprising further steps of:

manually orienting the portable remote controller device to obtain a concurrent linking of the wireless coupling signal with the first remotely controlled television signal tuning apparatus and a second remotely controlled television signal tuning apparatus;

actuating a send keybutton to concurrently dispatch the wireless coupling signal to the first remotely controlled television signal tuning apparatus and the second remotely controlled television signal tuning apparatus;

first sending said first data values via the concurrently linked said wireless coupling signal sent to the first remotely controlled television signal tuning apparatus; and, second sending said second data values via the concurrently linked said wireless coupling signal sent to the second remotely controlled television signal tuning apparatus.

9. The wireless remote controller method of claim 1 including a user initiated manual selection of at least one preset second operational command utilizing a dedicated keybutton and comprising further steps of:

assigning a portion of a non-volatile memory to be accessed by the dedicated keybutton;

presetting the assigned portion of the non-volatile memory with stored second data values representative of the preset second operational command;

selecting and actuating the dedicated keybutton;

reading the stored second data values retained in the assigned portion of the non-volatile memory;

sending the read said stored second data values to the first remotely controlled apparatus;

whereby, the first remotely controlled television signal tuning apparatus immediately effects the user initiated said second operational command.

10. A portable remote controller method for determining a channel selection on a remotely controlled first television signal tuning apparatus comprising steps of:

manually entering a user determined set of number digits representing a NEXT channel selection into a keypad portion of the portable remote controller;

storing first data values representing the manually entered said set of number digits in a first local register portion of the portable remote controller;

manually aiming a sender port of the portable remote controller device cooperatively towards a first receptor port of the first television signal tuning apparatus;

manually actuating a sender keybutton;

first establishing a first wireless signal coupling between the sender port and the first receptor port in response to the manual actuation of the sender keybutton;

reading the first data values stored in the first local register in response to the manually actuated said sender keybutton;

first encoding the read said first data values to be receptive by the receptor port of the first television signal tuning apparatus;

sending the first encoded said stored first data values via the first wireless signal coupling;

receiving the first encoded said first data values through the receptor port of the first television signal tuning apparatus; and, changing selection of the first television signal tuning apparatus to the NEXT channel selection.

11. The wireless remote controller method of claim 10 comprising a further step of:

displaying the stored data values for NEXT channel selection verification by the user prior to the manual aiming and the manual actuation of the sender keybutton.

12. The wireless remote controller method of claim 10 comprising further steps of:

displaying each said manual entry as an individual number digit telltale signal preferably enabled by a partial actuation of a keybutton on the keypad portion of the portable remote controller;

verifying the displayed said number digit telltale as representative of an intended entry; and, fully actuating the partially actuated said keybutton to obtain a completion of the manual entry of an acceptably verified said intended entry.

13. The wireless remote controller method of claim 10 comprising further steps of:

storing second data values representing a predetermined set of necessitous channel selection data ordinarily determined as one of channel 3 and channel 4 in a memory;

manually aiming the sender port of the portable remote controller device to concurrently cooperate with the first receptor port of the first television signal turning apparatus and a second receptor port of a second television signal tuning apparatus;

manually actuating the sender keybutton to first dispatch the first wireless coupling signal between the sender port and the first receptor port and to second dispatch a second wireless coupling signal between the sender port and the second receptor port;

reading the second data values said stored in the memory in response to the actuated said sender keybutton;

sending the read said stored second data values via the second wireless signal coupling;

receiving the second data values through the second receptor port of the second television signal tuning apparatus; and, setting channel selection of the second television signal tuning apparatus to correspond with the predetermined set of necessitous channel selection data.

14. The wireless remote controller method of claim 10 including an automatic normalization of a second television signal tuning apparatus and comprising further steps of:

aiming the sender port of the portable remote controller so as to concurrently cooperate with the first receptor port of the first television signal tuning apparatus and a second receptor port of the second television tuning apparatus;

coestablishing a second wireless coupling signal between the sender port and the second receptor port;

storing second data values representative of at least a necessitous channel number selection intended for remote control of the second television signal tuning apparatus;

reading the stored second data values in response to the actuated said sender keybutton;

second encoding the read said second data values to be receptive by a second receptor port;

sending the second encoded said stored second data values via the second wireless signal coupling;

receiving the second encoded said second data values through the receptor port of the second television signal tuning apparatus; and, reaffirming or resetting selection of the second television signal tuning apparatus to the necessitous channel selection ordinarily determined as one of channel 3 and channel 4 whenever a command is concurrently sent to the first television signal tuning apparatus.

15. The wireless remote controller method of claim 10 further including a filtering of keybutton entry rate to reduce a likelihood for multiple entries inadvertently introduced by a user experiencing a physically manifested nervous malady ordinarily expressed by uncertain physical actions and tremors and comprising the steps of:

triggering elapse of a time interval in response to initial actuation of a keybutton; and, blocking subsequent repeated entry of the keybutton response until the triggered elapse of the time interval is substantially completed.

16. A portable remote controller for determining a NEXT channel selection on a remotely controlled first television signal tuning apparatus comprising:

handheld user-entry device;

keypad means enabling a manual entry of a user determined set of number digits representing the NEXT channel selection;

first local register means for temporarily storing a set of first data values representing the manually entered said set of user determined number digits;

SEND keybutton means manually actuated by the user subsequent to a completion of the manual entry of the user determined set of number digits;

wireless signal sender means establishing a first wireless signal coupling between the sender port and the first receptor port in response to the manual actuation of the SEND keybutton means;

a recall means for reading the set of first data values temporarily stored in the first local register means in response to the manual actuation of the SEND keybutton means;

first encoding means for modulating the read set of first data values to be receptively recognized by the receptor port of the first television signal tuning apparatus;

demodulating means for recovering the first encoded said set of first data values submitted by the wireless signal sender means through the receptor port of the first television signal tuning apparatus; and, changing selection of the first television signal tuning apparatus to the NEXT channel selection manually entered through the keypad means by the user.

17. The portable remote controller apparatus of claim 16 further comprising a telltale means indicating the NEXT channel selection said manually entered through the keypad means and selected as at least one of:

a visible display means providing a viewable indication of a numerical value for the manual user-entries introduced through the keypad means; and, a sounder means providing an audible indication representative of the numerical value for the manual user-entries introduced through the keypad means.

18. The portable remote controller apparatus of claim 16 further comprising:

said keybutton means including a progressive operative means having a released position, first partially depressed position and a second fully depressed position; and, a confirmer means including a sounder means providing an audible indication essentially confirming the numerical value for the manual user-entry selection upon occurrence of the first partially depressed position of the keybutton means.

19. The portable remote controller apparatus of claim 16 further comprising a sending delay means for holding enablement of the wireless signal sender means until at least one of the following two events occurs:

a release of the actuation of the SEND keybutton is sensed; and, an elapse of a predetermined period of time occurs.

20. The portable remote controller apparatus of claim 16 further comprising:

memory means holding a predetermined set of necessitous channel selection data;

said wireless sender means concurrently aimed towards and second coupled with a second wireless receptor port means of a second television signal tuning apparatus; and, retriever means for reading the necessitous channel selection data; and, second encoded modulator means for combining the necessitous channel selection data with the wireless sender means;

whereby, when a change to NEXT channel signal is submitted to the first television signal tuning apparatus a concurrent signal dispatches to the second television signal tuning apparatus to maintain a tuning of the second television signal tuning apparatus to the necessitous channel and ordinarily determined as one of channel 3 and channel 4.

21. The portable remote controller apparatus of claim 16 wherein the first local register means further comprises a FIFO (first-in, first-out) memory means writeable from the keypad means and readable to the first encoder means.

22. The portable remote controller apparatus of claim 16 wherein the keypad means ordinarily comprises a set of dedicated keybuttons, each predetermined to be representative of a user's individual preference for any one of several channel selections, therefor including:

dedicated keybutton means;

a presettable memory means;

memory presetting means for enabling entry of and storing data indicative of the predetermined said user's individual preference for channel selection;

memory reader means for retrieving the indicative data stored in the presettable memory means in response to the user's actuation of the dedicated keybutton means; and, routing means for coupling the retrieved said indicative means with the modulator means;

whereby, the user's actuation of a dedicated keybutton means serves to encourage the wireless sender means to transmit a data signal pattern representative of at least two numerical digit values to enable the user's individual preference for the specific channel selection to be impressed on the first television signal tuning apparatus.

* * * * *